United States Patent
Lee et al.

(10) Patent No.: US 7,345,939 B2
(45) Date of Patent: Mar. 18, 2008

(54) SENSE AMPLIFIERS HAVING MOS TRANSISTORS THEREIN WITH DIFFERENT THRESHOLD VOLTAGES AND/OR THAT SUPPORT DIFFERENT THRESHOLD VOLTAGE BIASING

(75) Inventors: Hyun-Seok Lee, Gyeonggi-do (KR); Jong-Hyun Choi, Gyeonggi-do (KR); Ki-Chul Chun, Gyeonggi-do (KR); Jong-Eon Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/185,351

(22) Filed: Jul. 20, 2005

(65) Prior Publication Data

US 2006/0023537 A1 Feb. 2, 2006

(30) Foreign Application Priority Data

Aug. 2, 2004 (KR) ...................... 10-2004-0060977

(51) Int. Cl.
*G11C 7/02* (2006.01)
(52) U.S. Cl. ...................................... 365/208; 365/207
(58) Field of Classification Search ........... 365/189.11, 365/190, 205, 207, 208, 207 X, 208 O
See application file for complete search history.

(56) References Cited

U.S. PATENT DOCUMENTS

| | | | |
|---|---|---|---|
| 5,731,718 A | * | 3/1998 | Rieger .......................... 327/51 |
| 5,963,495 A | | 10/1999 | Kumar |
| 6,157,587 A | | 12/2000 | Reddy et al. |
| 6,407,956 B2 | * | 6/2002 | Ooishi ........................ 365/205 |
| 6,844,926 B2 | * | 1/2005 | Itaka ...................... 365/189.05 |

FOREIGN PATENT DOCUMENTS

| | | |
|---|---|---|
| JP | 08-007575 | 1/1996 |
| JP | 10-214485 | 8/1998 |

* cited by examiner

*Primary Examiner*—VanThu Nguyen
(74) *Attorney, Agent, or Firm*—Myers Bigel Sibley & Sajovec PA

(57) ABSTRACT

A sense amplifier includes a pair of sense bit lines and first and second MOS sense amplifiers. The first MOS sense amplifier has a first pair of MOS transistors of first conductivity type therein, which are electrically coupled across the pair of sense bit lines. This electrically coupling is provided so that each of the first pair of MOS transistors has a first source/drain terminal electrically connected to a corresponding one of the pair of sense bit lines and the second source/drain terminals of the first pair of MOS transistors are electrically connected together. The first pair of MOS transistors of first conductivity type are configured to have different threshold voltages or support different threshold voltage biasing. The second MOS sense amplifier has a first pair of MOS transistors of second conductivity type therein, which are electrically coupled across the pair of sense bit lines.

3 Claims, 18 Drawing Sheets

SENSE AMPLIFIERS HAVING MOS TRANSISTORS THEREIN WITH DIFFERENT THRESHOLD VOLTAGES AND/OR THAT SUPPORT DIFFERENT THRESHOLD VOLTAGE BIASING

CROSS-REFERENCE TO RELATED APPLICATION

This application claims the benefit of Korean Patent Application No. 2004-60977, filed Aug. 2, 2004, the disclosure of which is hereby incorporated herein by reference in its entirety.

FIELD OF THE INVENTION

The present invention relates to a semiconductor memory device and, more particularly, to a semiconductor memory device, which performs refresh operation and a method of sensing a bit line thereof.

BACKGROUND OF THE INVENTION

In general, a dynamic memory cell of a dynamic semiconductor memory device includes one transistor and one capacitor to store 1 bit of data. Data of a high level stored in the capacitor may vanish as time goes by. Therefore, in order to keep data, refresh operations should be performed periodically before data of a high level stored in the capacitor is vanished.

In the refresh operation of the dynamic semiconductor memory device, if word lines are selected in response to a refresh address, a charge sharing operation is performed between data of a high level stored in a memory cell connected between the selected word lines and a charge of a bit line of the memory cell connected to the selected word line, i.e., a precharge level. Thereafter, a bit line sense amplifier operates to sense and amplify a bit line pair to a power voltage level and a ground voltage level.

FIG. 1 is a block diagram illustrating configuration of a conventional semiconductor memory device. A memory cell array 100 includes a conjunction region CJ, a sense amplifier region SA, a sub word line driver region SWD, and a sub memory cell array block SMCA. The sub word line driver region SWD is arranged above and below the sub memory cell array block SMCA, the sense amplifier region SA is arranged on both sides of the sub memory cell array block SMCA, and the conjunction region CJ is arranged at a cross region of the sub word line driver region SWD and the sense amplifier SA. FIG. 1 shows just a partial configuration of the memory cell array 100.

Word line selecting signals PX1 and PX2 are arranged on a left side of the sub memory cell array block SMCA in a direction of crossing the conjunction region CJ and the sense amplifier region SA, and word line selecting signals PX3 and PX4 are arranged on a right side of the sub memory cell array block SMCA in a direction of crossing the conjunction region CJ and the sense amplifier region SA. Main word line selecting signals NWE1, . . . are arranged in a direction of crossing the sub word line driver region SWD and the sub memory cell array block SMCA, and sub word lines SWD 1 to SWD4 are arranged in the same direction as the main word line selecting signal NWE1, in the sub memory cell array block SMCA. Array bit line pairs (e.g., ABL1, ABL1B), are arranged in a perpendicular direction to the sub word lines SWL1 to SWL4, and sense bit line pairs (e.g., SBL1,SBL1B), are located between left and right array bit line pairs.

A bit line isolation gate ISOG1 is arranged between each of the left array bit line pairs (e.g., ABL1,ABL1B), and each of the sense bit line pairs (e.g., SBL1,SBL1B), a bit line isolation gate ISOG2 is arranged between each of the right array bit line pairs (e.g., ABL1,ABL1B), and each of the sense bit line pairs (e.g., SBL1,SBL1B), and a precharge circuit PRE1 is arranged between each of the left array bit line pairs (e.g., ABL1,ABL1B). A precharge circuit PRE2 is arranged between each of the right array bit line pairs (e.g., ABL1,ABL1B), a PMOS sense amplifier PSA and an NMOS sense amplifier NSA are arranged between each of the sense amplifier bit line pairs (e.g., SBL1,SBL1B), and an I/O gate IOG is arranged between each of the sense amplifier bit line pairs (e.g., SBL1,SBL1B), and each of I/O line pair IO1,IO1B. Each of the bit line isolation gates ISOG1 and ISOG2 includes NMOS transistors N3 and N4, the PMOS sense amplifier includes PMOS transistors P1 and P2, and an NMOS sense amplifier includes NMOS transistors N1 and N2.

In FIG. 1, a row address of 2-bit least significant bit ("LSB") is decoded to generate word line selecting signals PX1 to PX4, a row address of the rest bits except the 2-bit LSB is decoded to generate the main word line selecting signals (e.g., NWE1), and each of the word line selecting signals PX1 to PX4 and the main word line selecting signals NWE1 are combined to select the sub word lines SWL1 to SWL4. In the same way, each of the word line selecting signals PX1 to PX4 and each of the rest word line selecting signals (not shown) are combined to select corresponding four (4) sub word lines.

The memory cells of the sub memory cell array block SMCA includes a memory cell MC1 to MC4 which has one transistor N and one capacitor C and the memory cell MC1 is connected between the sub word line SWL1 and the inverted bit line BL1B, the memory cell MC2 which is connected between the sub word line SWL2 and the bit line BL1, the memory cell MC3 which is connected between the sub word line SWL3 and the bit line BL1, and the memory cell MC4 which is connected between the sub word line SWL4 and the inverted bit line BL1B. The memory cells, which are not shown, are connected and arranged in the same way described above.

Functions of the components of the semiconductor memory device of FIG. 1 are explained below. Each of the precharge circuits PRE1 and PRE2 precharge the array bit line pair ABL1,ABL1B to a precharge voltage VBL level during precharge operation. Each of the bit line isolation gates ISOG1 and ISOG2 is turned on to connect the array bit line pair ABL1,ABL1B and the sense bit line pair SBL1, SBL1B if the bit line isolation control signals ISO1 and ISO2 are applied during the precharge operation, and connects the left array bit line pair ABL1, ABL1B and the sense bit line pair SBL1,SBL1B if the left sub memory cell array block SMCA is selected and so the bit line isolation control signal ISO1 of a high voltage level is applied and connects the right array bit line pair ABL1,ABL1B and the sense bit line pair SBL1,SBL1B if the right sub memory cell array block SMCA is selected and so the bit line isolation control signal ISO2 of a high voltage level is applied, during read operation, write operation, and refresh operation. The PMOS sense amplifier PSA detects a signal of a low level of the sense bit line SBL1 or the inverted sense bit line SBL1B if a signal LA of a power voltage VCC level is applied and amplifies it to a power voltage VCC level, and the NMOS sense amplifier NSA detects a signal of a high level of the sense bit line SBL1 or the inverted sense bit line SBL1B if a signal LAB of a ground voltage level is applied and amplifies it to a ground voltage level. The I/O gate IOG is turned on in response to a column selecting signal (not shown) to transmit data between the sense bit line pair SBL1,SBL1B and the I/O line pair IO1,IO1B.

FIG. 2 is a view illustrating configuration of a circuit, which generates the signals LA,LAB. The circuit of FIG. 2 includes a controller 10, a PMOS transistor P3, and an NMOS transistor N5. Functions of the components of FIG. 3 are explained below. The controller 10 generates first and second bit line sense amplifier enable control signals LAPG, LANG of a low level and a high level if an active command ACT or a refresh command REF is applied. The PMOS transistor P3 generates a signal LA of a power voltage VCC level in response to the first bit line sense amplifier enable control signal LAPG of a low level. The NMOS transistor N5 generates a signal LAB of a ground voltage VSS level in response to the second bit line sense amplifier enable signal LANG of a high level.

FIG. 3 is a timing diagram illustrating the refresh operation of the semiconductor memory device of FIG. 1. FIG. 3 shows operation in case that in state that data of a high level is stored in the memory cell MC1 and the array bit line pair ABL1,ABL1B and the sense bit line pair SBL1,SBL1B are precharged to a precharge voltage VBL level, a refresh command REF is applied and so the sub word line SWL1 is selected.

If the sub word line SWL1 is selected, a level of the sub word line SWL1 is gradually increased, as predetermined time lapses after the sub word line SWL1 is selected, the NMOS transistor N of the memory cell MC1 is turned on, so that a charge sharing operation is performed between a charge of the capacitor C and a precharge level of the inverted array bit line ABL1B. At this time, since the bit line isolation gate ISOG1 is perfectly turned on, the inverted array bit line ABL1B and the inverted sense bit line SBL1B are changed to the same level. If voltages of the inverted array bit line ABL1B and the inverted sense bit line SBL1B are increased by a voltage ΔV by the charge sharing operation during a charge sharing operation period T, the first and second bit line sense amplifier enable control signals LA,LAB of a power voltage VCC level and a ground voltage VSS level are generated. Thus, a voltage between a gate and a source of the NMOS transistor N1 becomes greater than a threshold voltage of the NMOS transistor N1, so that the NMOS transistor N1 is turned on to thereby reduce a voltage of the sense bit line SBL1. As a result, a voltage between a gate and a source of the PMOS transistor P2 becomes greater than a threshold voltage of the PMOS transistor P2, so that the PMOS transistor P2 is turned on to thereby increase a voltage of the inverted sense bit line SBL1B. So, the sense bit line SBL1 is amplified to a ground voltage VSS level, and the inverted sense bit line SBL1B is amplified to a power voltage VCC level.

Even though not shown, in case that data of a low level is stored in the memory cell MC1 and the sub word line SWL1 is selected, the charge sharing operation is performed to reduce a voltage of the inverted sense bit line SBL1B by a voltage ΔV. Thereafter, if a signal LA of a power voltage VCC level and a signal LAB of a ground voltage VSS are applied, the PMOS transistor P1 and the NMOS transistor N2 are turned on to amplify a voltage of the inverted sense bit line SBL1B to a ground voltage level and to amplify a voltage of the sense bit line SBL1 to a power voltage VCC level.

In the bit line sense amplifier of the conventional semiconductor memory device described above, since threshold voltages of the PMOS transistors P1 and P2 are identically designed and threshold voltage of the NMOS transistors N1 and N2 are identically designed, ability of the PMOS transistor P1 of sensing data of a low level of the inverted sense bit line SBL1 is identical to ability of the PMOS transistor P2 of sensing data of a low level of the sense bit line SBL1, and ability of the NMOS transistor N1 of sensing data of a high level of the inverted sense bit line SBL1B is identical to ability of the NMOS transistor N2 of sensing data of a high level of the sense bit line SBL1.

In general, a refresh cycle of the refresh operation depends on sensing ability of the bit line sense amplifier and discharging time of data of a high level stored in the memory cell. That is, in order for the bit line sense amplifier to perform the sensing operation, the charge sharing operation is performed during the charge sharing operation period T before data of a high level stored in the memory cell is completely discharged, so that a voltage of the sense bit line (or inverted sense bit line) should be increased by a voltage ΔV from a precharge voltage VBL. The refresh operation for the same word line is performed at an interval of a refresh cycle, and as the refresh cycle is short, power consumption is more increased. The refresh cycle has close correlation with ability of sensing data of a high level of the bit line sense amplifier. If the memory cell is excellent in maintaining data of a high level, the refresh cycle can be set to be long. However, the memory cell has limitations to ability of maintaining data of a high level, and since the refresh cycle is set by assuming a case that ability of the memory cell of maintaining data of a high level is worst when the semiconductor memory device is designed, there is a limitation to increasing the refresh cycle.

However, if the bit line sense amplifier of the semiconductor memory device has excellent sensing ability for data of a high level, that is, the bit line sense amplifier is designed to sense very small level variation of a voltage of the sense bit line (or inverted sense bit line), the refresh cycle can be set to be long.

SUMMARY OF THE INVENTION

Embodiments of the invention include sense amplifiers configured to sense and amplify relatively small differential signals established across a pair of differential sense bit lines. According to these embodiments, a sense amplifier is provided with multiple MOS sense amplifiers therein. These MOS sense amplifiers include a first MOS sense amplifier having a first pair of MOS transistors of first conductivity type therein electrically coupled across a pair of sense bit lines. This first pair of MOS transistors of first conductivity type can be configured to have different threshold voltages so that enhanced sensing of relatively small differential voltages on the sense bit lines can be achieved. Alternatively, the first pair of MOS transistors may support different threshold voltage biasing. This different threshold voltage biasing may be achieved by independently controlling the level at which the substrate terminals of the MOS transistors are biased during a sense and amplify operation. These MOS sense amplifiers may also include a second MOS sense amplifier having a first pair of MOS transistors of second conductivity type therein electrically coupled across the pair of sense bit lines. In some of these embodiments, the first MOS sense amplifier is an NMOS sense amplifier and the second MOS sense amplifier is a PMOS sense amplifier or vice versa.

According to still further embodiments of the invention, the first MOS sense amplifier also includes a second pair of MOS transistors of first conductivity type electrically coupled across the pair of sense bit lines. This second pair of MOS transistors is configured to have different threshold voltages as well. Similarly, the first pair of MOS transistors of second conductivity type can be configured to have different threshold voltages or support different threshold voltage biasing.

Additional embodiments of the invention include a first MOS sense amplifier having a pair of MOS transistors of first conductivity type therein electrically coupled across a pair of sense bit lines. First, second and third sense amplifier enable lines are also provided. The first sense amplifier enable line is electrically coupled to source terminals of the pair of MOS transistors of first conductivity type. However, to support different threshold voltage biasing, the second sense amplifier enable line is electrically coupled to a substrate terminal of a first one of the pair of MOS transistors of first conductivity type and a third sense amplifier enable line is electrically coupled to a substrate terminal of a second one of the pair of MOS transistors of first conductivity type. A controller/driver is also provided. This controller is configured to independently drive the first, second and third sense amplifier enable lines during an operation to amplify a differential voltage established across the pair of sense bit lines.

Additional embodiments of the invention include a first MOS sense amplifier having first and second MOS transistors of first conductivity type therein. The first MOS transistor has a first threshold voltage, a drain terminal electrically connected to a first one of a pair of sense bit lines and a gate terminal electrically connected to a second one of the pair of sense bit lines. The second MOS transistor has a second threshold voltage unequal to the first threshold voltage, a drain terminal electrically connected to the second one of the pair of sense bit lines and a gate terminal electrically connected to a first one of the pair of sense bit lines. A second MOS sense amplifier may also be provided. The second MOS sense amplifier has third and fourth MOS transistors of first conductivity type therein. The third MOS transistor has the second threshold voltage, a drain terminal electrically connected to a first one of the pair of sense bit lines and a gate terminal electrically connected to a second one of the pair of sense bit lines. The fourth MOS transistor has the first threshold voltage, a drain terminal electrically connected to the second one of the pair of sense bit lines and a gate terminal electrically connected to a first one of the pair of sense bit lines.

Still further embodiments of the invention include a semiconductor memory device. This memory devices includes a first memory cell connected between a first word line accessed by a first address and an inverted bit line; a second memory cell connected between a second word line accessed by a second address and a bit line; a first type sense amplifier serially connected between the bit line and the inverted bit line and having a first type first MOS transistor sensing the inverted bit line and a first type second MOS transistor sensing the bit line if a first enable signal of a first voltage is applied; a second type first sense amplifier serially connected between the bit line and the inverted bit line and having a second type first MOS transistor sensing the inverted bit line and a second type second MOS transistor sensing the bit line if a second enable signal of a second voltage is applied, wherein the second type first MOS transistor has a better sensing ability than the second type second MOS transistor; and a second type second sense amplifier serially connected between the bit line and the inverted bit line and having a second type third MOS transistor sensing the inverted bit line and a second type fourth MOS transistor sensing the bit line if a third enable signal of the second voltage is applied, wherein the second type fourth MOS transistor has a better sensing ability than the second type third MOS transistor.

The first type transistor is a PMOS transistor, and the second type transistor is an NMOS transistor. A threshold voltage of the second type first MOS transistor is lower than a threshold voltage of the second type second MOS transistor, and a threshold voltage of the second type fourth MOS transistor is lower than a threshold voltage of the second type third MOS transistor. The first type sense amplifier and the second type first sense amplifier operate before the second type second sense amplifier operates if the first word line is selected, and the first type sense amplifier and the second type second sense amplifier operate before the second type first sense amplifier operates if the second word line is selected. The first type sense amplifier and the second type first sense amplifier operate if the first word line is selected, and the first type sense amplifier and the second type second sense amplifier operate if the second word line is selected. The first voltage may be a power voltage, and the second voltage may be ground voltage.

A memory device according to another embodiment includes a first memory cell connected between a first word line accessed by a first address and an inverted bit line; a second memory cell connected between a second word line accessed by a second address and a bit line; a first type first sense amplifier serially connected between the bit line and the inverted bit line and having a first type first MOS transistor sensing the inverted bit line and a first type second MOS transistor sensing the bit line if a first enable signal of a first voltage is applied, wherein the first type second MOS transistor has a better sensing ability than the first type first MOS transistor; a first type second sense amplifier serially connected between the bit line and the inverted bit line and having a first type third MOS transistor sensing the inverted bit line and a first type fourth MOS transistor sensing the bit line if a second enable signal of the first voltage is applied, wherein the first type third MOS transistor has a better sensing ability than the first type fourth MOS transistor; and a second type sense amplifier serially connected between the bit line and the inverted bit line and having a second type first MOS transistor sensing the inverted bit line and a second type second MOS transistor sensing the bit line if a third enable signal of a second voltage is applied. The first type transistor may be a PMOS transistor, and the second type transistor may be an NMOS transistor. A threshold voltage of the first type first MOS transistor is higher than a threshold voltage of the first type second MOS transistor, and a threshold voltage of the first type fourth MOS transistor is higher than a threshold voltage of the first type third MOS transistor. The first type first sense amplifier and the second type sense amplifier operate before the first type second sense amplifier operates if the first word line is selected, and the first type second sense amplifier and the second type sense amplifier operate before the first type first sense amplifier operates if the second word line is selected. The first type first sense amplifier and the second type sense amplifier operate if the first word line is selected, and the first type second sense amplifier and the second type sense amplifier operate if the second word line is selected. The first voltage may be a power voltage, and the second voltage may be ground voltage.

A memory device according to another embodiment of the invention includes a first memory cell connected between a first word line accessed by a first address and an inverted bit line; a second memory cell connected between a second word line accessed by a second address and a bit line; a first type first sense amplifier serially connected between the bit line and the inverted bit line and having a first type first MOS transistor sensing the inverted bit line and a first type second MOS transistor sensing the bit line if a first enable signal of a first voltage is applied, wherein the first type second MOS transistor has a better sensing ability than the first type first MOS transistor; a first type second sense amplifier serially connected between the bit line and the inverted bit line and having a first type third MOS transistor sensing the inverted bit line and a first type fourth MOS transistor sensing the bit line if a second enable signal of a second voltage is applied, wherein the first type third MOS transistor has a better sensing ability than the first type fourth MOS transistor; a second type first sense amplifier serially connected between the bit line and the inverted bit line and having a second type first MOS transistor sensing the inverted bit line and a second type second MOS transistor sensing the bit line if a third enable signal of the first voltage is applied, wherein the second type first MOS transistor has a better sensing ability than the second type second MOS transistor; and a second type second sense amplifier serially connected between the bit line and the inverted bit line and having a second type third MOS transistor sensing the inverted bit line and a second type fourth MOS transistor sensing the bit line if a fourth enable signal of the second voltage is applied, wherein the second type fourth MOS transistor has a better sensing ability than the second type third MOS transistor. The first type transistor may be a PMOS transistor, and the second type transistor may be an NMOS transistor.

A threshold voltage of the first type first MOS transistor is lower than a threshold voltage of the second type second MOS transistor, a threshold voltage of the first type fourth MOS transistor is lower than a threshold voltage of the first type third MOS transistor, a threshold voltage of the second type first MOS transistor is higher than a threshold voltage of the second type second MOS transistor, and a threshold voltage of the second type fourth MOS transistor is higher than a threshold voltage of the second type third MOS transistor.

The first type first sense amplifier and the second type first sense amplifier operate before the first type second sense amplifier and the second type second sense amplifier operate if the first word line is selected, and the first type second sense amplifier and the second type second sense amplifier operate before the first type first sense amplifier and the first type first sense amplifier and the second type first sense amplifier operate if the second word line is selected.

DETAILED DESCRIPTION OF THE INVENTION

Figure 1:
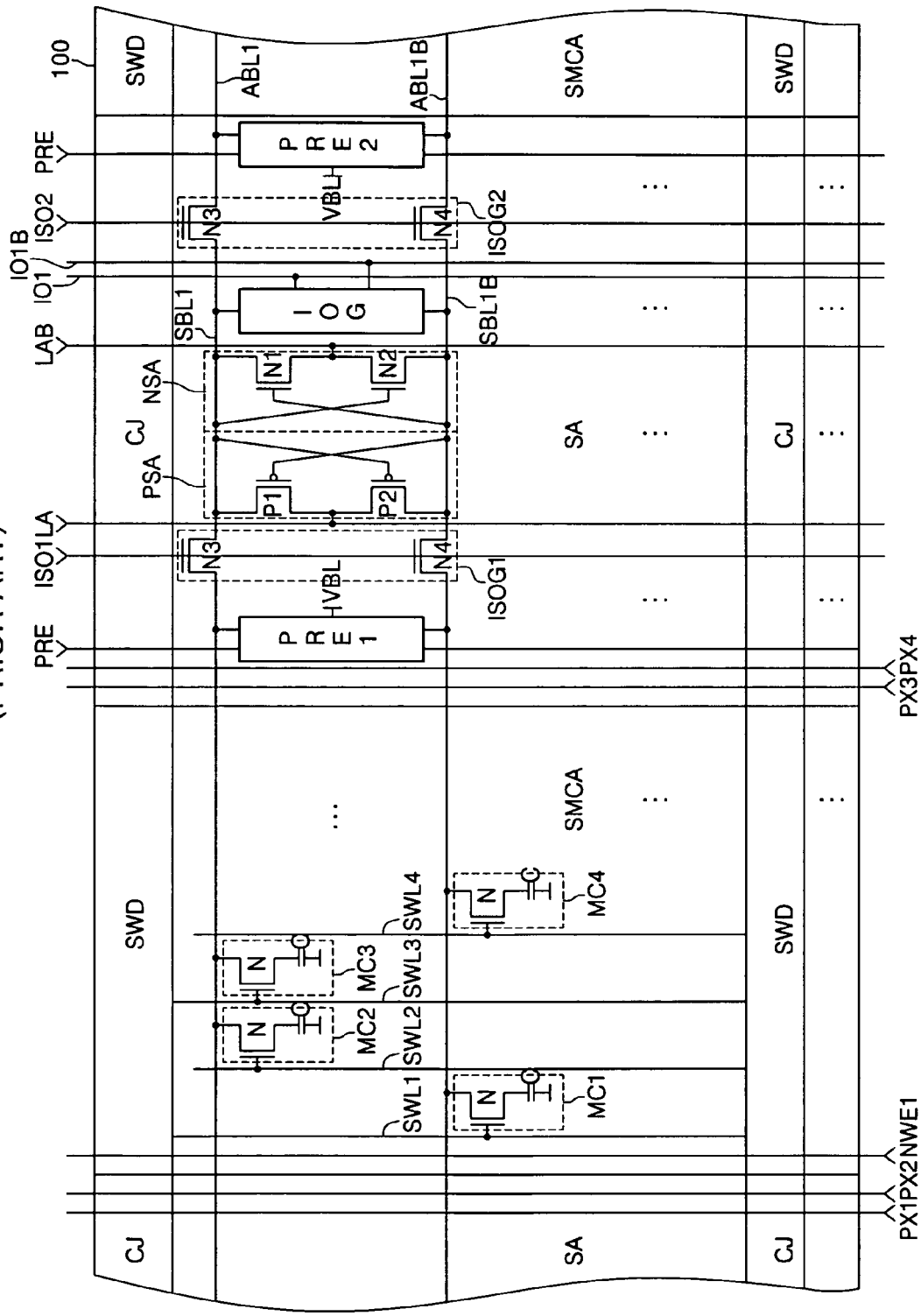
FIG. 1 is a block diagram illustrating configuration of a conventional semiconductor memory device.
Figure 2:
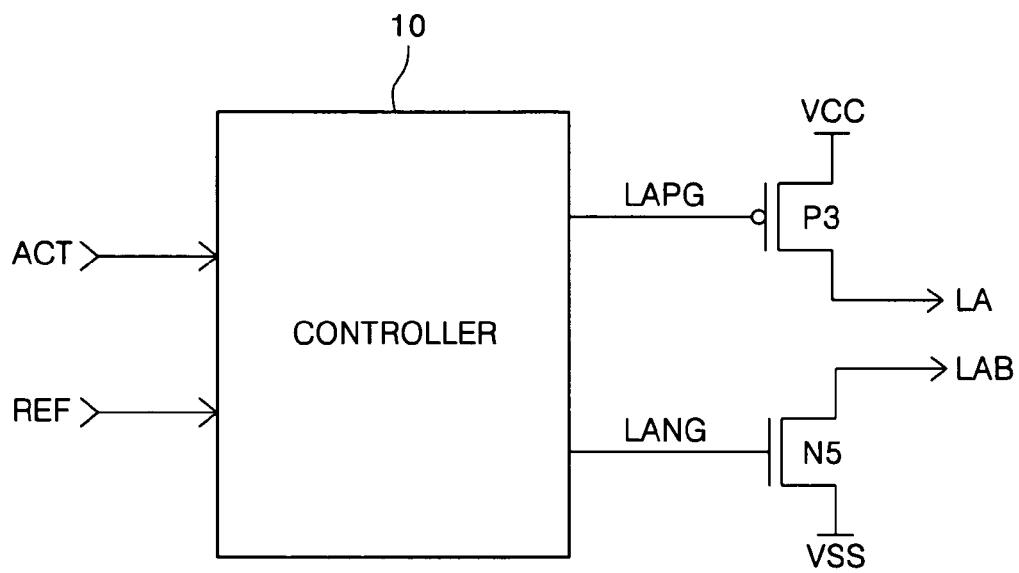
FIG. 2 is a view illustrating configuration of a circuit, which generates signals LA,LAB.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Moreover, the terms "first conductivity type" and "second conductivity type" refer to opposite conductivity types such as N or P-type, however, each embodiment described and illustrated herein includes its complementary embodiment as well Like reference numbers refer to like elements throughout and signal lines and signals thereon may be referred to by the same reference characters. Signals may also be synchronized and/or undergo minor Boolean operations (e.g., inversion) without being considered different signals.

Figure 4:
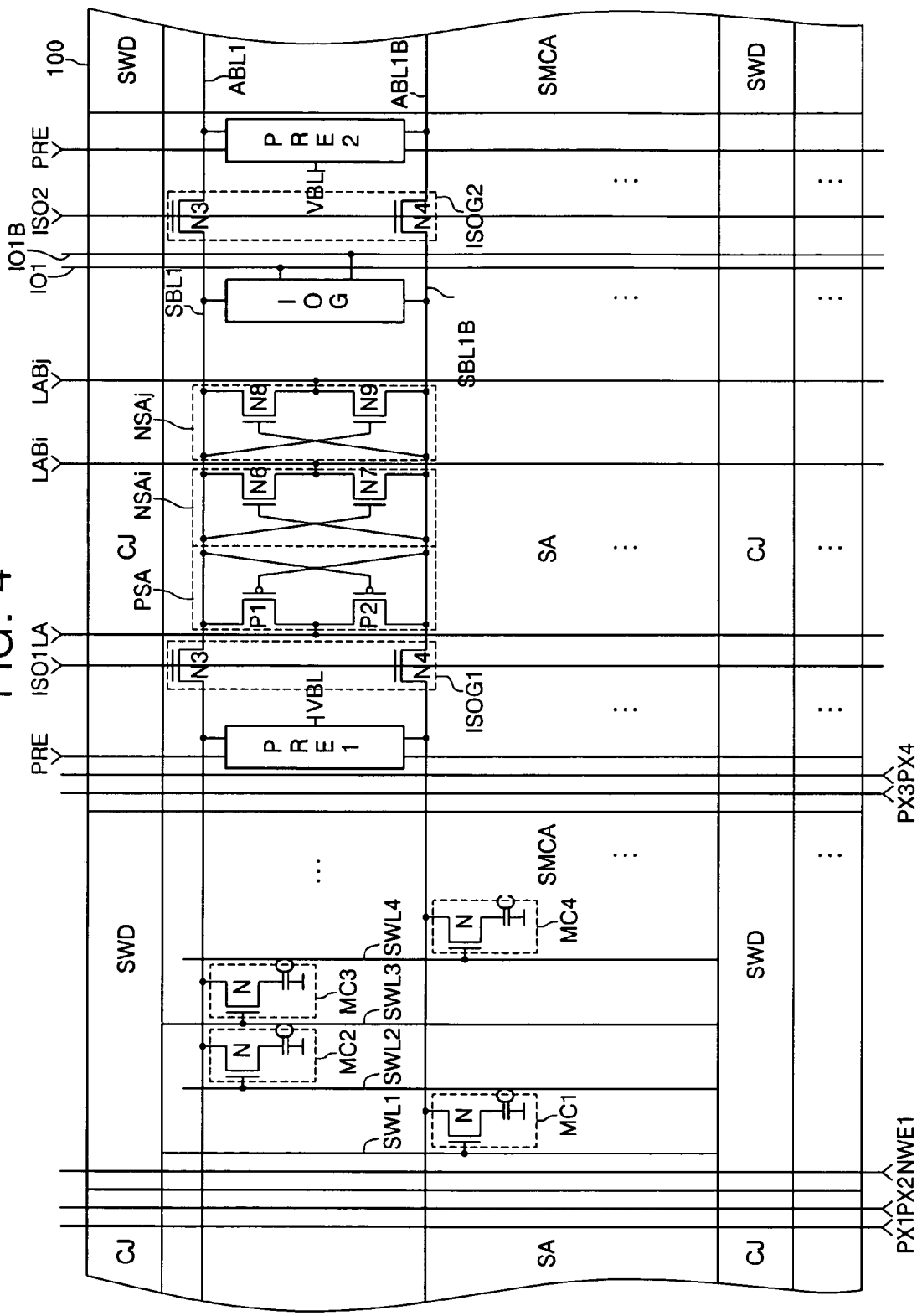
FIG. 4 is a block diagram illustrating configuration of a semiconductor memory device according to a first embodiment of the present invention.

FIG. 4 is a block diagram illustrating configuration of a semiconductor memory device according to a first embodiment of the present invention. The NMOS sense amplifier NSA is replaced with a first NMOS sense amplifier NSAi and a second NMOS sense amplifier NSAj. The first NMOS sense amplifier NSAi includes NMOS transistors N6 and N7, and the second sense amplifier NSAj includes NMOS transistors N8 and N9. The NMOS transistor N6 is relatively lower in threshold voltage than the NMOS transistor N7. and the NMOS transistor N9 is relatively lower in threshold voltage than the NMOS transistor N8, whereas the PMOS transistors P1 and P2 are designed to have the same threshold voltage. Like reference numerals of FIGS. 1 and 4 denote like parts and like functions, and thus description on those is omitted.

The memory cells MC1 and MC4 store data of a high level and the sub word line SWL1 or the sub word line SWL4 is selected during the refresh operation, the charge sharing operation is performed. Then, if a signal LA of a power voltage VCC level and a signal LABi of a ground voltage VSS level are applied, since the NMOS transistor N6 is lower in threshold voltage than the NMOS transistor N7, even if a voltage of the inverted sense bit line SBL1B is raised a little, a voltage difference between a gate and a source of the NMOS transistor N6 becomes greater than a threshold voltage of the NMOS transistor N6, so that the NMOS transistor N6 is turned on to reduce a voltage of the sense bit line SBL1. In response, a voltage difference between a gate and a source of the PMOS transistor P2 becomes greater than a threshold voltage of the PMOS transistor P2, so that the PMOS transistor P2 is turned on to increase a voltage of the inverted sense bit line SBL1B. Thereafter, if a signal LABj of a ground voltage VSS level is applied, the NMOS transistor N8 of the NMOS sense amplifier NSAj is turned on, so that the NMOS transistors N6 and N8 amplify the sense bit line SBL1 to a ground voltage VSS level together. The PMOS transistor P2 amplifies the inverted bit line SBL1B to a power voltage VCC level.

On the other hand, if the memory cells MC2 and MC3 store data of a high level and the sub word line SWL2 or the sub word line SWL3 is selected during the refresh operation, the charge sharing operation is performed. Then, if a signal LA of a power voltage VCC level and a signal LABj of a ground voltage VSS level are applied, since the NMOS transistor N9 is lower in threshold voltage than the NMOS transistor N8, even if a voltage of the sense bit line SBL1 is raised a little, a voltage difference between a gate and a source of the NMOS transistor N9 becomes greater than a threshold voltage of the NMOS transistor N9, so that the NMOS transistor N9 is turned on to reduce a voltage of the inverted sense bit line SBL1B. Thus, a voltage difference between a gate and a source of the PMOS transistor P1 becomes greater than a threshold voltage of the PMOS transistor P1, so that the PMOS transistor P1 is turned on to increase a voltage of the sense bit line SBL1. Thereafter, if a signal LABi of a ground voltage VSS level is applied, the NMOS transistor N7 is turned on, so that the NMOS transistors N7 and N9 pull the sense bit line SBL1 to a ground voltage VSS level together. The PMOS transistor P1 makes the inverted sense bit line SBL1B be a power voltage VCC level.

Figure 5:
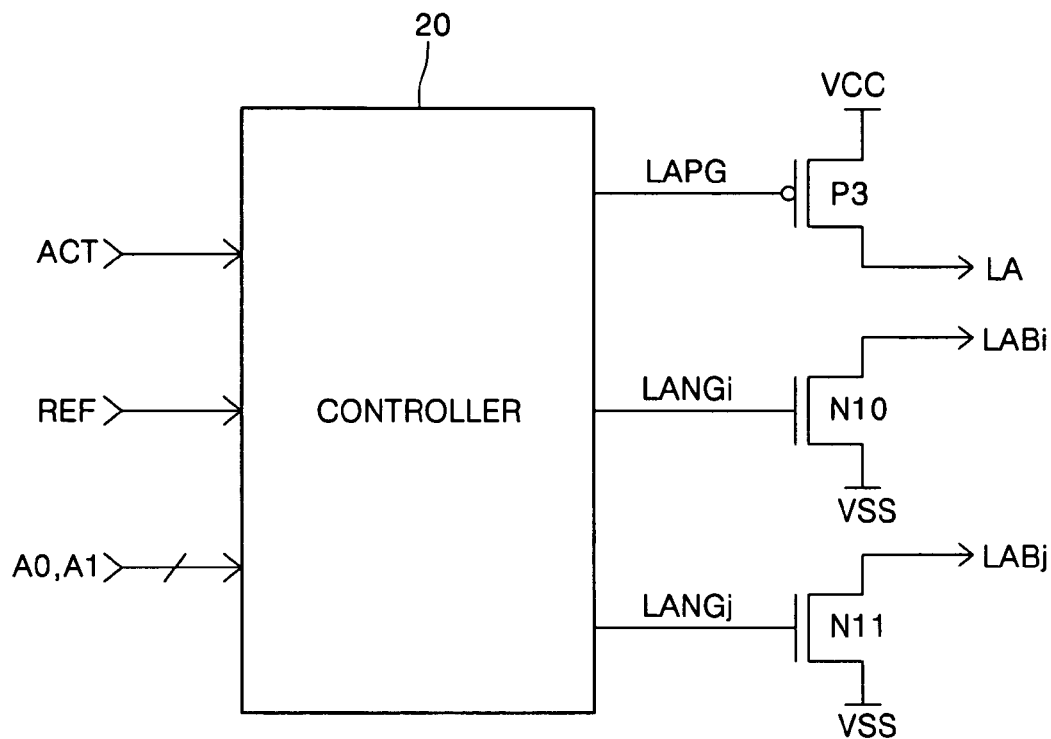
FIG. 5 is a view illustrating a circuit of generating signals LA and LAB of FIG. 4.

FIG. 5 is a view illustrating a circuit of generating signals LA and LAB of FIG. 4. The circuit of FIG. 5 includes a controller 20, a PMOS transistor P3, and NMOS transistors N10 and N11. The controller 20 generates first and second bit line sense amplifier enable control signals LAPG and LANGi of a low level and a high level if an active command ACT or a refresh command REF is applied and a 2-bit least significant bit ("LSB") of row address A0 and A1 is applied and so the 2-bit LSB of row address A0,A1 are "00" or "11". The PMOS transistor P3 generates a signal LA of a power voltage VCC level in response to the first bit line sense amplifier enable control signal LAPG of a low level. The NMOS transistor N10 generates a signal LABi of a ground voltage VSS level in response to the second bit line sense amplifier enable signal LANGi of a high level. Thereafter, a third bit line sense amplifier enable control signal LANGj of a high level is generated. The NMOS transistor N11 generates a signal LABj of a ground voltage VSS level in response to the third bit line sense amplifier enable control signal LANGj of a high level.

On the other hand, the controller 20 generates the first and third bit line sense amplifier enable control signals LAPG and LANGj of a low level and a high level if an active command ACT or a refresh command REF is applied and a 2-bit least significant bit ("LSB") of row address A0 and A1 is applied and so the 2-bit LSB of row address A0A1 are "01" or "10". The PMOS transistor P3 generates a signal LA of a power voltage VCC level in response to the first bit line sense amplifier enable control signal LAPG of a low level. The NMOS transistor N11 generates a signal LABj of a ground voltage VSS level in response to the third bit line sense amplifier enable signal LANGj of a high level. Thereafter, the second bit line sense amplifier enable control signal LANGi of a high level is generated. The NMOS transistor N10 generates a signal LABi of a ground voltage VSS level in response to the second bit line sense amplifier enable control signal LANGi of a high level.

Figure 3:
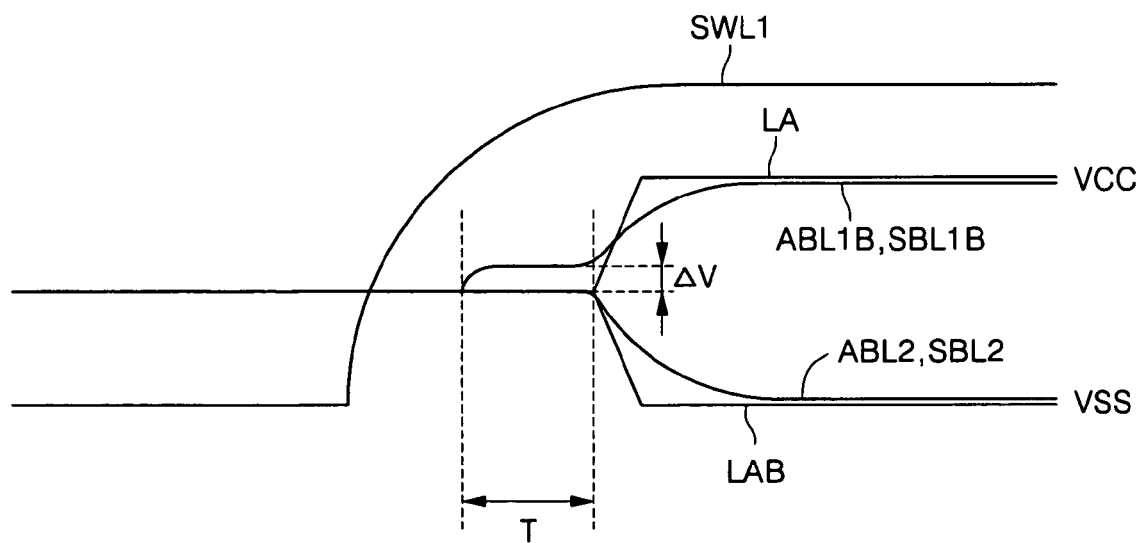
FIG. 3 is a timing diagram illustrating refresh operation of the semiconductor memory device of FIG. 1.
Figure 6:
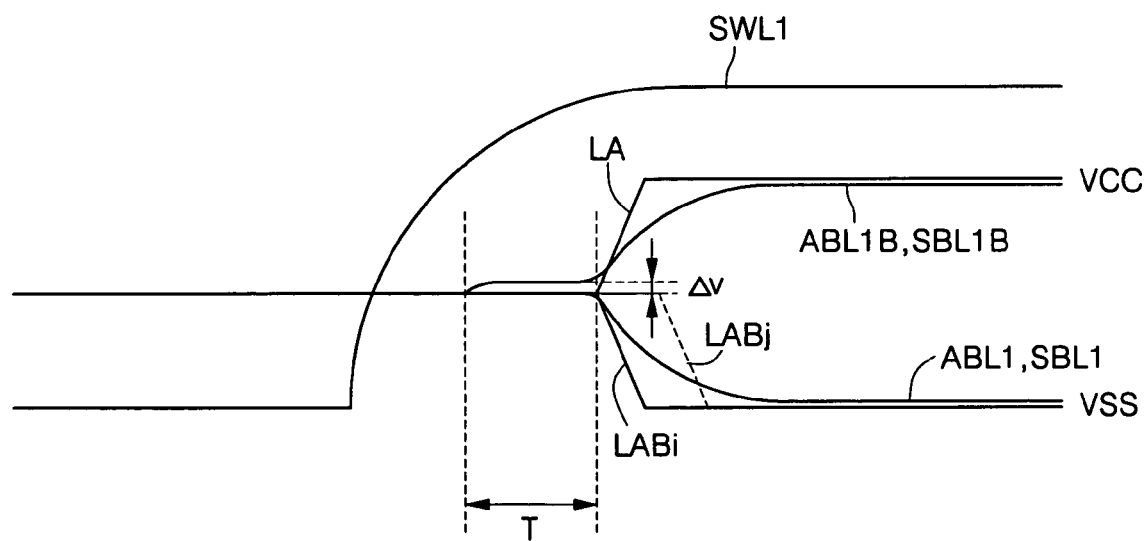
FIG. 6 is a timing diagram illustrating the refresh operation of the semiconductor memory device of FIG. 4.

FIG. 6 is a timing diagram illustrating the refresh operation of the semiconductor memory device of FIG. 4. The refresh operation is performed under the same condition as that of FIG. 3. Operation during the charge sharing operation period T is the same as the timing diagram of FIG. 3. Here, since the refresh cycle is set to be long, levels of the inverted array bit line ABL1B and the inverted sense bit line SBL1B during the charge sharing operation period T are raised by a voltage $\Delta v$. The voltage $\Delta v$ of FIG. 6 is lower in level than the voltage $\Delta V$ of FIG. 3.

If the levels of the inverted array bit line ABL1B and the inverted sense bit line SBL1B are raised by a voltage $\Delta v$ by the charge sharing operation during the charge sharing operation period T, the first and second bit line sense amplifier enable control signals LA and LABi of a power voltage VCC level and a ground voltage VSS level are generated. The NMOS transistor N6 is turned on in response to a voltage of the inverted sense bit line SBL1B to reduce a level of the sense bit line SBL1, and the PMOS transistor P2 is turned on in response to a voltage of the sense bit line SBL1 to increase a level of the inverted sense bit line SBL1B. Thereafter, the third bit line sense amplifier enable control signal LABj of a ground voltage VSS level is generated. The PMOS sense amplifier PSA and the NMOS sense amplifiers NSAi and NSAj perform the sensing operation to amplify voltages of the inverted array bit line ABL1B and the inverted sense bit line SBL1B to a power voltage VCC level and to amplify voltages of the array bit line ABL1 and the sense bit line SBL1 to a ground voltage VSS level.

Even though not shown, if in state that the memory cell MC2 stores data of a high level and the array bit line pair ABL1,ABL1B and the sense bit line pair SBL1,SBL1B are precharged to a precharge voltage VBL level, the refresh command REF is applied so that the sub word line SWL2 is selected, the signals LA and LABj are generated, and then the signal LABi is generated.

As described above, the bit line sense amplifier of the semiconductor memory device according to the first embodiment of the present invention can perform the sensing operation even if a level of the inverted sense bit line SBL1B is varied by a small $\Delta v$ since the NMOS transistor N6 is lower in threshold voltage than the NMOS transistor N7 in case that the memory cells MC1 and MC4 are selected. In case that the memory cells MC2 and MC3 are selected, it is possible to perform the sensing operation even if a level of the sense bit line SBL1 is varied by a small $\Delta v$ since the NMOS transistor N9 is lower in threshold voltage than the NMOS transistor N8. That is, by having the NMOS transistor N6 for data of a high level to have greater sensing ability than the NMOS transistor N7 and having the NMOS transistor N9 for data of a high level to have greater sensing ability than the NMOS transistor N8, the sensing ability of the bit line sense amplifier for data of a high level is improved, thereby lengthening the refresh cycle.

Operation of the semiconductor memory device according to the first embodiment of the present invention has been explained with a case that a signal LABj/LABi of a ground voltage VSS level is applied after a signal LABi/LABj of a ground voltage level is applied. But, a signal LABj/LABi of a floating state can be applied after a signal LABi/LABj of a ground voltage VSS level is applied. Thus, it is not absolutely in all embodiments to operate both NMOS sense amplifiers NSAi and NSAj.

Figure 7:
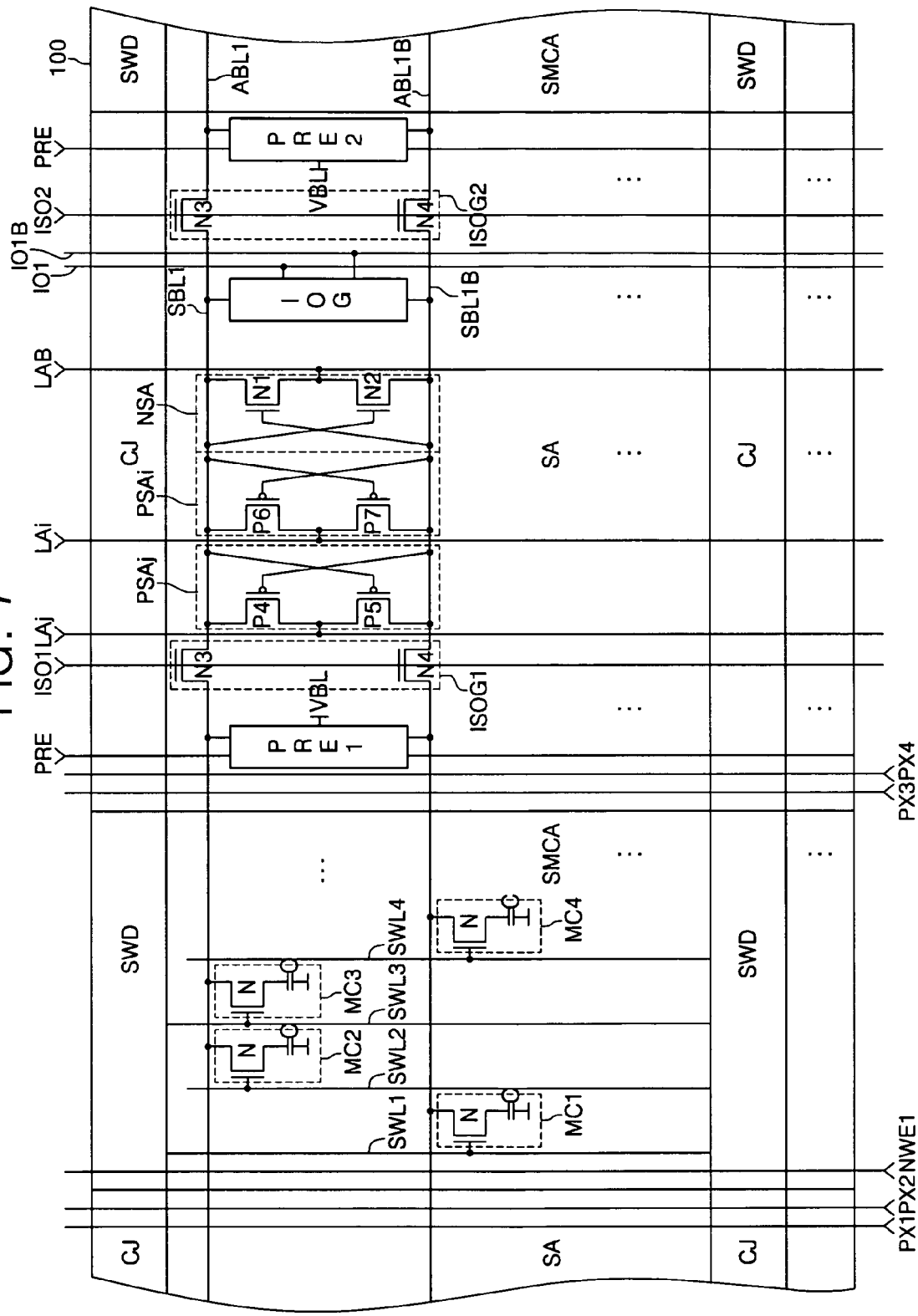
FIG. 7 is a block diagram illustrating a semiconductor memory device according to a second embodiment of the present invention.

FIG. 7 is a block diagram illustrating a semiconductor memory device according to a second embodiment of the present invention. The PMOS sense amplifier PSA is replaced with a first PMOS sense amplifier PSAi and a second PMOS sense amplifier PSAj. The first PMOS sense amplifier PSAi includes PMOS transistors P6 and P7, and the second sense amplifier PSAj includes PMOS transistors P4 and P5. This second embodiment is the dual of the first embodiment with respect to the NMOS and PMOS sense amplifiers. The PMOS transistor P5 has a greater threshold voltage than the PMOS transistor P4, and the PMOS transistor P6 has a greater threshold voltage than the PMOS transistor P7, and the NMOS transistors N1 and N2 are designed to have the same threshold voltage.

Like reference numerals of FIGS. 1 and 7 denote like parts and like functions, and thus description on those is omitted. If the memory cells MC1 and MC4 store data of a high level and the sub word line SWL1 or the sub word line SWL4 is selected during the refresh operation, the charge sharing operation is performed. Then, if a signal LAi of a power voltage VCC level and a signal LAB of a ground voltage VSS level are applied, since the PMOS transistor P6 is greater in threshold voltage than the PMOS transistor P7, if a signal LAi of a power voltage VCC level is applied, a voltage difference between a gate and a source of the PMOS transistor P7 becomes greater than a threshold voltage of the PMOS transistor P7, so that the PMOS transistor P7 is turned on to amplify a voltage of the inverted sense bit line SBL1B to a power voltage VCC level. Thus, a voltage difference between a gate and a source of the NMOS transistor N1 becomes greater than a threshold voltage of the NMOS transistor N1, so that the NMOS transistor N1 is turned on to amplify a voltage of the sense bit line SBL1 to a ground voltage VSS level. Thereafter, if a signal LAj of a power voltage VCC level is applied, the PMOS transistor P5 is turned on, so that the PMOS transistors P5 and P7 amplify the inverted sense bit line SBL1B to a power voltage VCC level together.

On the other hand, if the memory cells MC2 and MC3 store data of a high level and the sub word line SWL2 or the sub word line SWL3 is selected during the refresh operation, the charge sharing operation is performed. Then, if a signal LAj of a power voltage VCC level and a signal LAB of a ground voltage VSS level are applied, the PMOS transistor P4 is turned on to amplify a voltage of the inverted sense bit line SBL1B to a power voltage VCC level. The NMOS transistor N2 is turned on to amplify a voltage of the sense bit line SBL1 to a ground voltage VSS level. Thereafter, if a signal LAi of a power voltage VCC level is applied, the PMOS transistor P6 is turned on, so that the PMOS transistors P4 and P6 amplify the inverted sense bit line SBL1B to a power voltage VCC level together.

Figure 8:
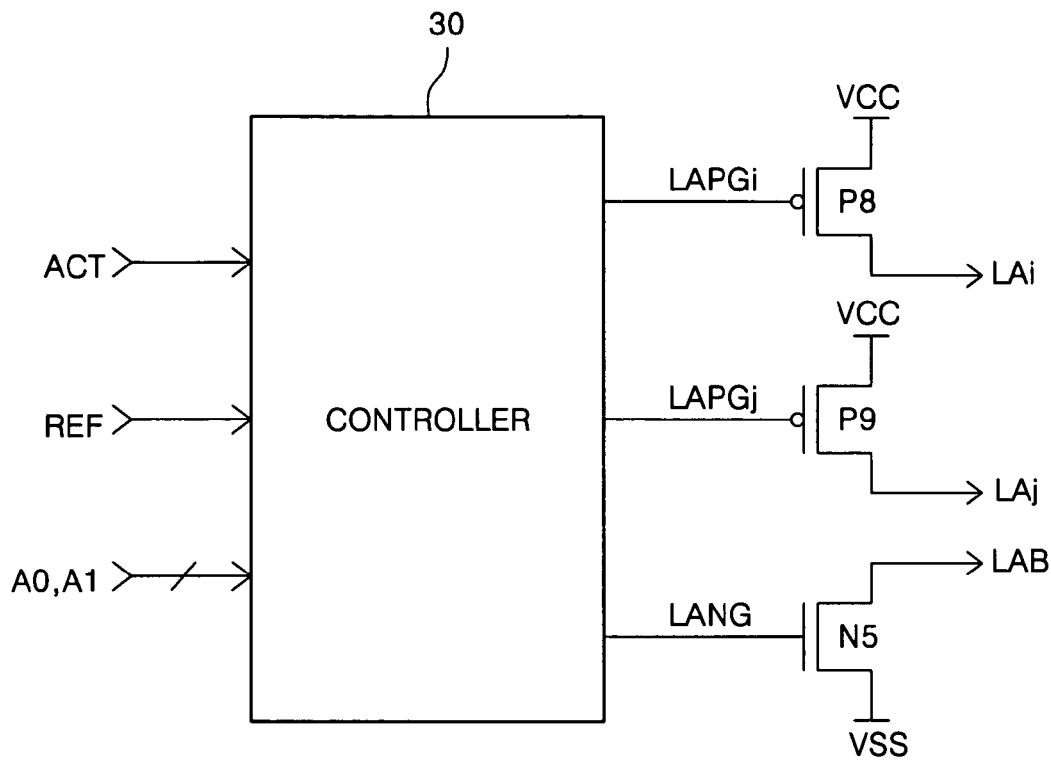
FIG. 8 is a view illustrating a circuit of generating signals LAi, LAj and LAB of FIG. 7.

FIG. 8 is a view illustrating a circuit of generating signals LAi, LAj and LAB of FIG. 7. The circuit of FIG. 8 includes a controller 30, PMOS transistors P8 and P9, and an NMOS transistor N5. The controller 30 generates first and second bit line sense amplifier enable control signals LAPGi and LANG of a low level and a high level if an active command ACT or a refresh command REF is applied and a 2-bit LSB of row address A0 and A1 is applied and so the 2-bit LSB of row address A0,A1 are "00" or "11". The PMOS transistor P8 generates a signal LAi of a power voltage VCC level in response to the first bit line sense amplifier enable control signal LAPGi of a low level. The NMOS transistor N5 generates a signal LAB of a ground voltage VSS level in response to the second bit line sense amplifier enable signal LANG of a high level. Thereafter, a third bit line sense amplifier enable control signal LAPGj of a low level is generated. The PMOS transistor P9 generates a signal LAj of a power voltage VCC level in response to the third bit line sense amplifier enable control signal LAPGj of a low level.

On the other hand, the controller 30 generates the second and third bit line sense amplifier enable control signals LANG and LAPGj of a low level and a high level if an active command ACT or a refresh command REF is applied and a 2-bit LSB of row address A0 and A1 is applied and so the 2-bit LSB of row address A0A1 are "01" or "10". The PMOS transistor P9 generates a signal LAj of a power voltage VCC level in response to the third bit line sense amplifier enable control signal LAPGj of a low level. The NMOS transistor N5 generates a signal LAB of a ground voltage VSS level in response to the second bit line sense amplifier enable signal LANG of a high level. Thereafter, the first bit line sense amplifier enable control signal LAPGi of a low level is generated. The PMOS transistor P8 generates a signal LAi of a power voltage VCC level in response to the first bit line sense amplifier enable control signal LAPGi of a low level.

Figure 9:
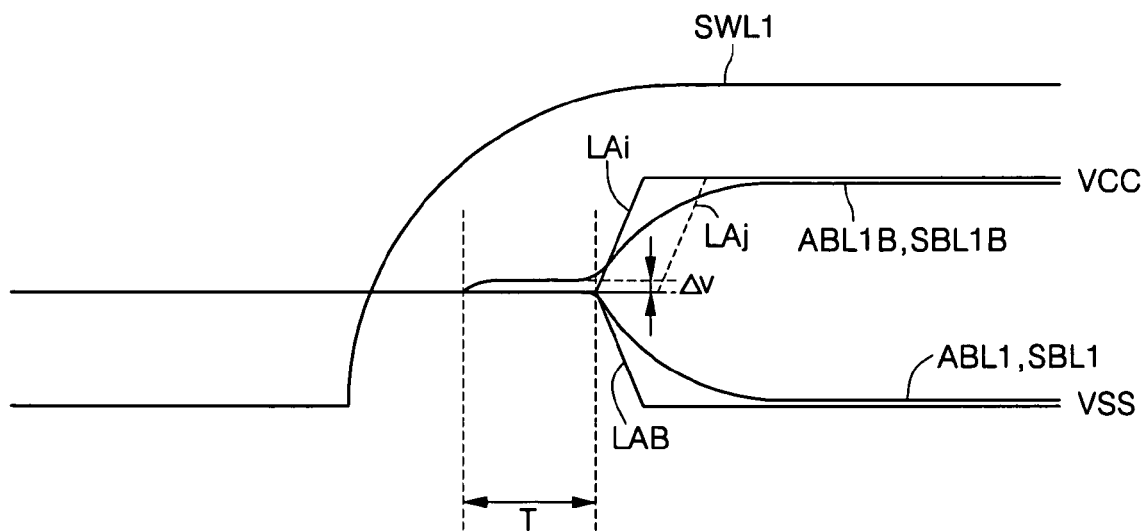
FIG. 9 is a timing diagram illustrating the refresh operation of the semiconductor memory device of FIG. 7.

FIG. 9 is a timing diagram illustrating the refresh operation of the semiconductor memory device of FIG. 7. The refresh operation is performed under the same condition as that of FIG. 3. Operation during the charge sharing operation period T is the same as the timing diagram of FIG. 6. If the voltages of the inverted array bit line ABL1B and the inverted sense bit line SBL1B are increased by a voltage Δv by the charge sharing operation during the charge sharing operation period T, the first and second bit line sense amplifier enable control signals LAi and LAB of a power voltage VCC level and a ground voltage VSS level are generated. The PMOS transistor P7 is turned on by sensing a voltage of the sense bit line SBL1 to increase a level of the inverted sense bit line SBL1B, and the NMOS transistor N1 is turned on by sensing a voltage of the inverted sense bit line SBL1B to reduce a level of the sense bit line SBL1. Thereafter, the third bit line sense amplifier enable control signal LAj of a power voltage VCC level is generated. The PMOS sense amplifiers PSAi and PSAj and the NMOS sense amplifier NSA perform the sensing operation to amplify voltages of the inverted array bit line ABL1B and the inverted sense bit line SBL1B to a power voltage VCC level and to amplify voltages of the array bit line ABL1 and the sense bit line SBL1 to a ground voltage VSS level. That is, since the PMOS transistor P7 is designed to be lower in threshold voltage than the PMOS transistor P6, if a signal LA1 of a power voltage VCC level is applied, a voltage difference between a gate and a source of the PMOS transistor P7 becomes greater than a threshold voltage of the PMOS transistor P7, so that the PMOS transistor P7 is turned on to raise a level of the inverted sense bit line SBL1B.

Even though not shown, if in state that the memory cell MC2 stores data of a high level and the array bit line pair ABL1,ABL1B and the sense bit line pair SBL1,SBL1B are precharged to a precharge voltage VBL level, the refresh command REF is applied so that the sub word line SWL2 is selected, the signals LAj and LAB are generated, and then the signal LABi is generated.

As described above, in the bit line sense amplifier of the semiconductor memory device according to the second embodiment of the present invention, it is possible for the PMOS transistor P7 to perform the sensing operation even if a level of the inverted sense bit line SBL1B is varied by Δv since the PMOS transistor P7 is lower in threshold voltage than the PMOS transistor P6 in case of the refresh operation for the memory cells MC1 and MC4. In case of the refresh operation for the memory cells MC2 and MC3, it is possible for the PMOS transistor P4 to perform the sensing operation even if a level of the sense bit line SBL1 is varied by Δv since the PMOS transistor P4 is lower in threshold voltage than the PMOS transistor P5. Thus, the sensing ability of the bit line sense amplifier for data of a high level is improved, thereby lengthening the refresh cycle.

Operation of the semiconductor memory device according to the second embodiment of the present invention has been explained with a case that a signal LAj/LAi of a power voltage VCC level is applied after a signal LAi/LAj of a power voltage VCC level is applied. But, in alternative embodiments, a signal LAj/LAi of a floating state can be applied after a signal LAi/LAj of a power voltage VSCC level is applied. Thus, it is not necessary to operate two PMOS sense amplifiers PSAi and PSAj.

Figure 10:
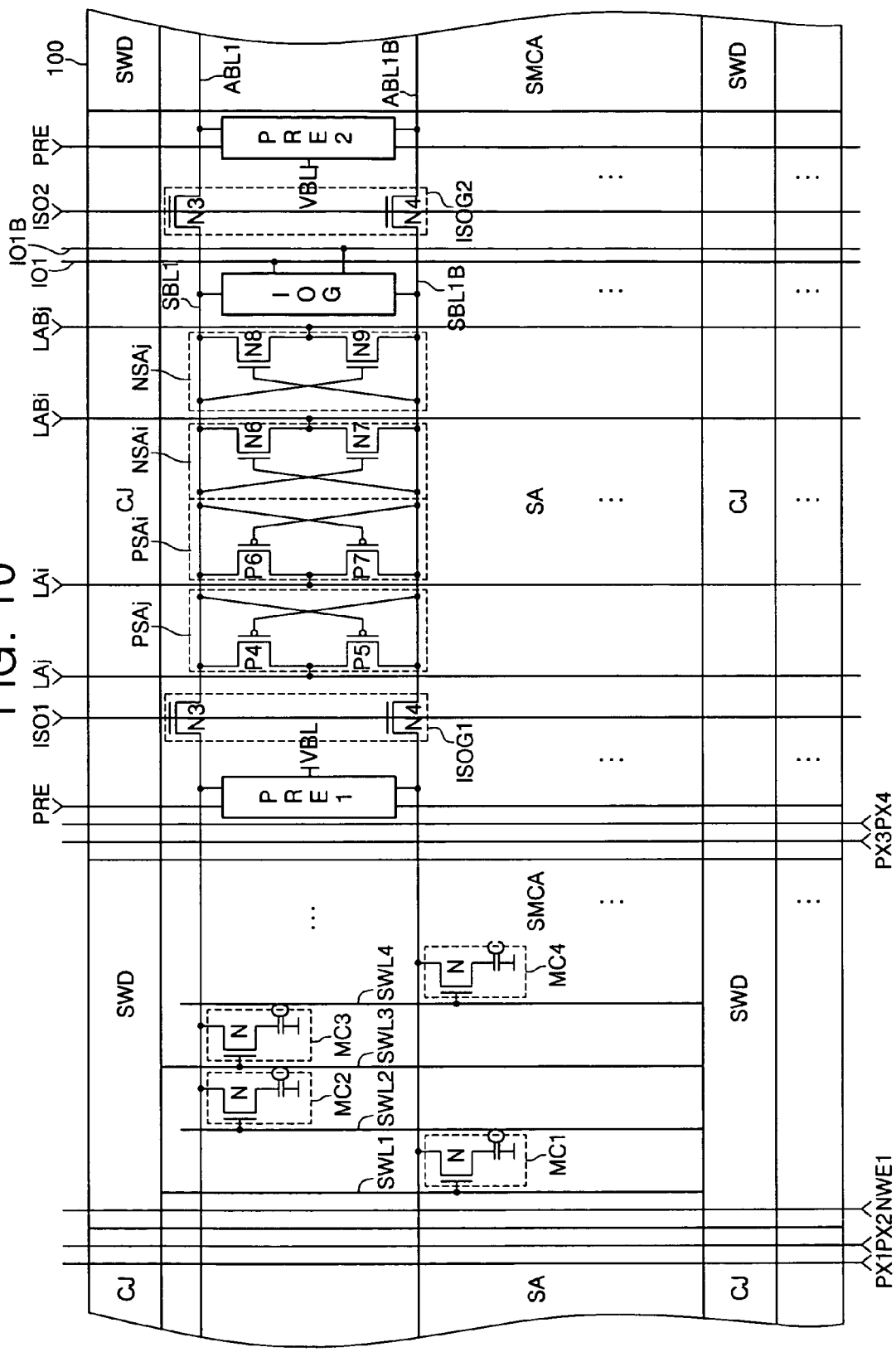
FIG. 10 is a block diagram illustrating a semiconductor memory device according to a third embodiment of the present invention.

FIG. 10 is a block diagram illustrating a semiconductor memory device according to a third embodiment of the present invention. The NMOS sense amplifier NSA of FIG. 1 is replaced with NMOS sense amplifiers NSAi and NSAj, and the PMOS sense amplifier PSA is replaced with PMOS sense amplifiers PSAi and PSAj. The NMOS sense amplifier NSAi includes NMOS transistors N6 and N7, and the NMOS sense amplifier NSAj includes NMOS transistors N8 and N9, and the PMOS sense amplifier PSAj includes PMOS transistors P4 and P5, and the PMOS sense amplifier PSAi includes NMOS transistors P6 and P7. In FIG. 10, the PMOS transistor P5 is relatively greater in threshold voltage than the PMOS transistor P4, the PMOS transistor P6 is relatively greater in threshold voltage than the PMOS transistor P7, the NMOS transistor N6 is relatively lower in threshold voltage than the NMOS transistor N7, and the NMOS transistor N9 is relatively lower in threshold voltage than the NMOS transistor N8. Like reference numerals of FIGS. 1 and 7 denote like parts and like functions, and thus description on those is omitted.

If the memory cells MC1 and MC4 store data of a high level and the sub word line SWL1 or the sub word line SWL4 is selected during the refresh operation, the charge sharing operation is performed. Then, if a signal LAi of a power voltage VCC level and a signal LABi of a ground voltage VSS level are applied, a voltage difference between a gate and a source of the PMOS transistor P7 becomes greater than a threshold voltage of the PMOS transistor P7, and a voltage difference between a gate and a source of the NMOS transistor N6 becomes greater than a threshold voltage of the NMOS transistor N6. The PMOS transistor P7 is turned on to amplify a voltage of the inverted sense bit line SBL1B to a power voltage VCC level, and the NMOS transistor N6 is turned on to amplify a voltage of the sense bit line SBL1 to a ground voltage VSS level. Thereafter, if a signal LAj of a power voltage VCC level and a signal LABj of a ground voltage VSS level are applied, the PMOS sense amplifiers PSAi and PSAj and the NMOS sense amplifiers NSAi and NSAj perform the sensing operation together to make a voltage of the sense bit line SBL1 be a ground voltage VSS level and a voltage of the inverted sense bit line SBL1B be a power voltage VCC level.

On the other hand, if the memory cells MC2 and MC3 store data of a high level and the sub word line SWL2 or the sub word line SWL3 is selected during the refresh operation, the charge sharing operation is performed. Then, if a signal LAj of a power voltage VCC level and a signal LABj of a ground voltage VSS level are applied, a voltage difference between a gate and a source of the PMOS transistor P4 becomes greater than a threshold voltage of the PMOS transistor P4, and a voltage difference between a gate and a source of the NMOS transistor N9 becomes greater than a threshold voltage of the NMOS transistor N9. The PMOS transistor P4 is turned on to amplify a voltage of the sense bit line SBL1 to a power voltage VCC level, and the NMOS transistor N9 is turned on to amplify a voltage of the inverted sense bit line SBL1B to a ground voltage VSS level.

Thereafter, if a signal LAi of a power voltage VCC level and a signal LABi of a ground voltage VSS level are applied, the PMOS sense amplifiers PSAi and PSAj and the NMOS sense amplifiers NSAi and NSAj perform the sensing operation make a voltage of the inverted sense bit line SBL1B be a power voltage VCC level and a voltage of the sense bit line SBL1 be a ground voltage VSS level.

Figure 11:
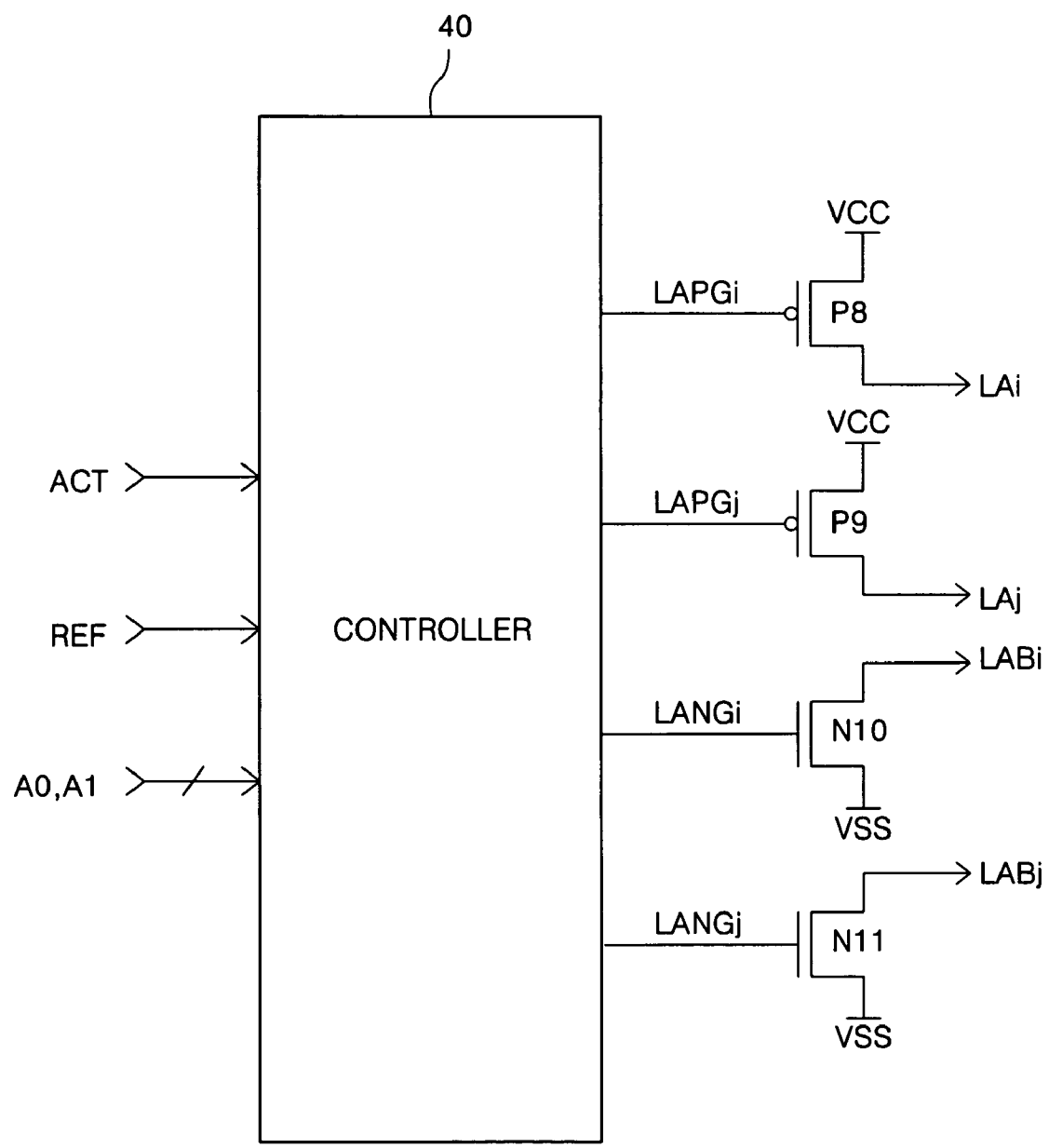
FIG. 11 is a view illustrating a circuit of generating signals Lai, LAj, LABi, and LABj of FIG. 10.

FIG. 11 is a view illustrating a circuit of generating signals LAi, LAj, LABi, and LABj of FIG. 10. The circuit of FIG. 11 includes a controller 40, PMOS transistors P8 and P9, and NMOS transistors N10 and N11. The controller 40 generates first and second bit line sense amplifier enable control signals LAPGi and LANGi of a low level and a high level if an active command ACT or a refresh command REF is applied and a 2-bit LSB of row address A0 and A1 is applied and so the 2-bit LSB of row address A0,A1 are "00" or "11". The PMOS transistor P8 generates a signal LAi of a power voltage VCC level in response to the first bit line sense amplifier enable control signal LAPGi of a low level, and the NMOS transistor N10 generates a signal LABi of a ground voltage VSS level in response to the second bit line sense amplifier enable signal LANGi of a high level. Thereafter, a third bit line sense amplifier enable control signal LAPGj of a low level and a fourth bit line sense amplifier enable control signal LANGj of a high level are generated. The PMOS transistor P9 generates a signal LAj of a power voltage VCC level in response to the third bit line sense amplifier enable control signal LAPGj of a low level, and the NMOS transistor N11 generates a signal LABj of a ground voltage VSS level in response to the fourth bit line sense amplifier enable control signal LANGj of a high level.

On the other hand, the controller 40 generates the third and fourth bit line sense amplifier enable control signals LAPGj and LANGj of a low level and a high level if an active command ACT or a refresh command REF is applied and a 2-bit LSB of row address A0 and A1 is applied and so the 2-bit LSB of row address A0A1 are "01" or "10". The PMOS transistor P9 generates a signal LAj of a power voltage VCC level in response to the third bit line sense amplifier enable control signal LAPGj of a low level, and the NMOS transistor N11 generates a signal LABj of a ground voltage VSS level in response to the fourth bit line sense amplifier enable signal LANGj of a high level.

Thereafter, the first bit line sense amplifier enable control signal LAPGi of a low level and the second bit line sense amplifier enable control signal LANGi of a high level are generated. The PMOS transistor P8 generates a signal LAi of a power voltage VCC level in response to the first bit line sense amplifier enable control signal LAPGi of a low level, and the NMOS transistor N10 generates a signal LABi of a ground voltage VSS level in response to the second bit line sense amplifier enable control signal LANGi of a high level.

Figure 12:
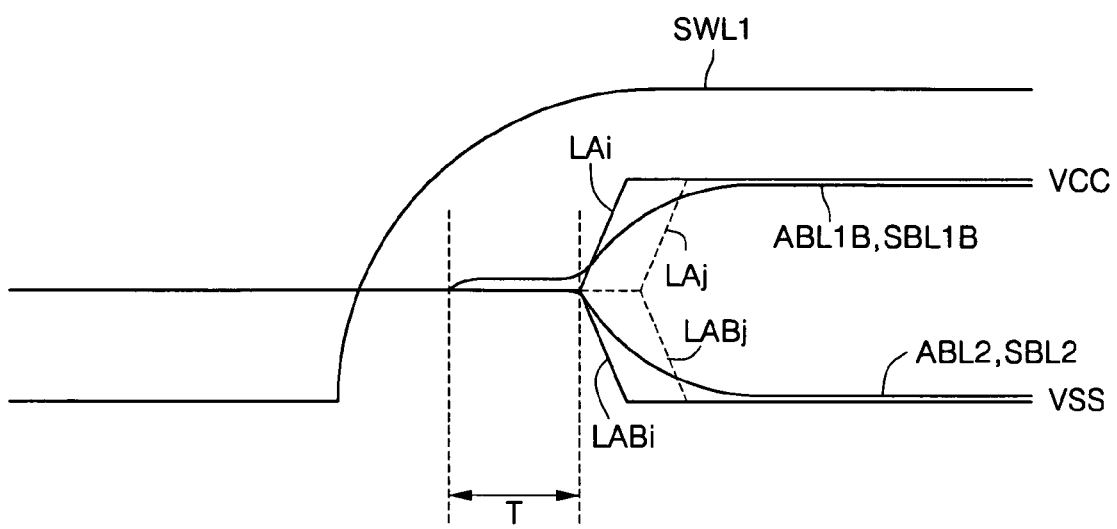
FIG. 12 is a timing diagram illustrating the refresh operation of the semiconductor memory device of FIG. 10.

FIG. 12 is a timing diagram illustrating the refresh operation of the semiconductor memory device of FIG. 10. The refresh operation is performed under the same condition as that of FIG. 3. Operation during the charge sharing operation period T is the same as the timing diagram of FIG. 6. If the levels of the inverted array bit line ABL1B and the inverted sense bit line SBL1B are raised by a voltage Δv by the charge sharing operation during the charge sharing operation period T, the first and second bit line sense amplifier enable control signals LAi and LABi of a power voltage VCC level and a ground voltage VSS level are generated. The PMOS transistor P7 senses a voltage of the sense bit line SBL1 to increase a level of the inverted sense bit line SBL1B, and the NMOS transistor N6 senses a voltage of the inverted sense bit line SBL1B to reduce a level of the sense bit line SBL1. Thereafter, the third bit lines sense amplifier enable control signal LAj of a power voltage VCC level and the fourth bit line sense amplifier enable control signal LABj of a ground voltage VSS level are generated. The PMOS sense amplifiers PSAi and PSAj and the NMOS sense amplifiers NSAi and NSAj perform the sensing operation together to amplify the inverted sense bit line SBL1B to a power voltage VCC level and the sense bit line SBL1 to a ground voltage VSS level.

Even though not shown, if in state that the memory cell MC2 stores data of a high level and the array bit line pair ABL1,ABL1B and the sense bit line pair SBL1,SBL1B are precharged to a precharge voltage VBL level, the refresh command REF is applied so that the sub word line SWL2 is selected, the signals LAj and LABj are generated, and then the signals LAi and LABi is generated.

In the bit line sense amplifier of the semiconductor memory device according to the first embodiment of the present invention, during the refresh operation for the memory cells MC1 and MC4, it is possible for the PMOS transistor P7 to perform the sensing operation even if a level of the inverted sense bit line SBL1B is varied by Δv since the PMOS transistor P7 is lower in threshold voltage than the PMOS transistor P6, and it is possible for the NMOS transistor N6 to perform the sensing operation even if a level of the inverted sense bit line SBL1B is increased by Δv since the NMOS transistor N6 is lower in threshold voltage than the NMOS transistor N7. During the refresh operation for the memory cells MC2 and MC3, it is possible for the PMOS transistor P4 to perform the sensing operation even if a level of the sense bit line SBL1 is varied by Δv since the PMOS transistor P4 is lower in threshold voltage than the PMOS transistor P5, and it is possible for the NMOS transistor N9 to perform the sensing operation even if a level of the sense bit line SBL1 is increased by Δv since the NMOS transistor N9 is lower in threshold voltage than the NMOS transistor N8.

Operation of the semiconductor memory device according to the third embodiment of the present invention has been explained with a case where a signal LAj/LAi of a power voltage VCC level and a signal LABj/LABi of a ground voltage VSS level are applied after a signal LAi/LAj of a power voltage VCC level and a signal LABi/LABj of a ground voltage level are applied. But, signals LAj/LAi and LABj/LABi of a floating state can be applied after a signal LAi and LAj of a power voltage VCC level and a signal LABi/LABj of a ground voltage VSS level are applied. Thus, it is not necessary to operate two NMOS sense amplifiers NSAi and NSAj and two PMOS sense amplifiers PSAi and PSAj.

Figure 13:
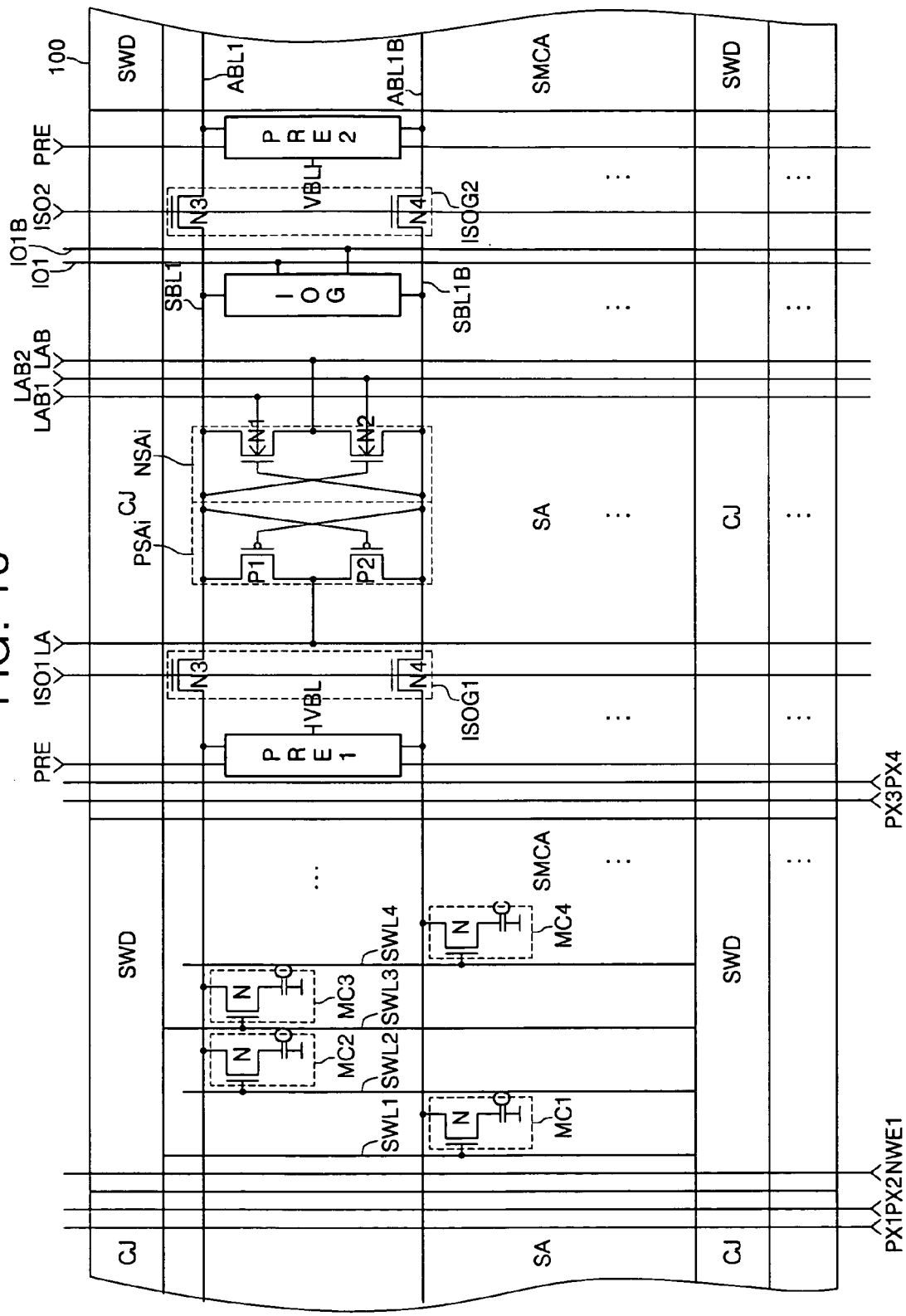
FIG. 13 is a block diagram illustrating configuration of a semiconductor memory device according to a fourth embodiment of the present invention.

FIG. 13 is a block diagram illustrating configuration of a semiconductor memory device according to a fourth embodiment of the present invention. The semiconductor memory device of FIG. 13 has the same configuration as that of FIG. 1 except that signals LAB1 and LAB2 are respectively applied to respective substrates of the NMOS transistors N1 and N2.

Like reference numerals of FIGS. 1 and 13 denote like parts and like functions. Thus, operation when the signals LAB1 and LAB2 are applied will be explained below. If the memory cells MC1 and MC4 store data of a high level and the sub word line SWL1 or the sub word line SWL4 is selected during the refresh operation, the charge sharing operation is performed. Then, if a signal LAB1 having a level higher than a substrate voltage VBB and a signal LAB2 of a substrate voltage VBB level are applied, a threshold voltage of the NMOS transistor N1 becomes lower than a threshold voltage of the NMOS transistor N2. Then, if a signal LA of a power voltage VCC level and a signal LAB of a ground voltage VSS level are applied, the same operation as the bit line sense amplifier of FIG. 4 is performed.

On the other hand, if the memory cells MC2 and MC3 store data of a high level and the sub word line SWL2 or the sub word line SWL3 is selected during the refresh operation, the charge sharing operation is performed. Then, if a signal LAB2 having a level higher than a substrate voltage VBB and a signal LABI of a substrate voltage VBB level are applied, a threshold voltage of the NMOS transistor N2 becomes lower than a threshold voltage of the NMOS transistor N1. Then, if a signal LA of a power voltage VCC level and a signal LAB of a ground voltage VSS level are applied, the same operation as the bit line sense amplifier of FIG. 4 is performed.

Figure 14:
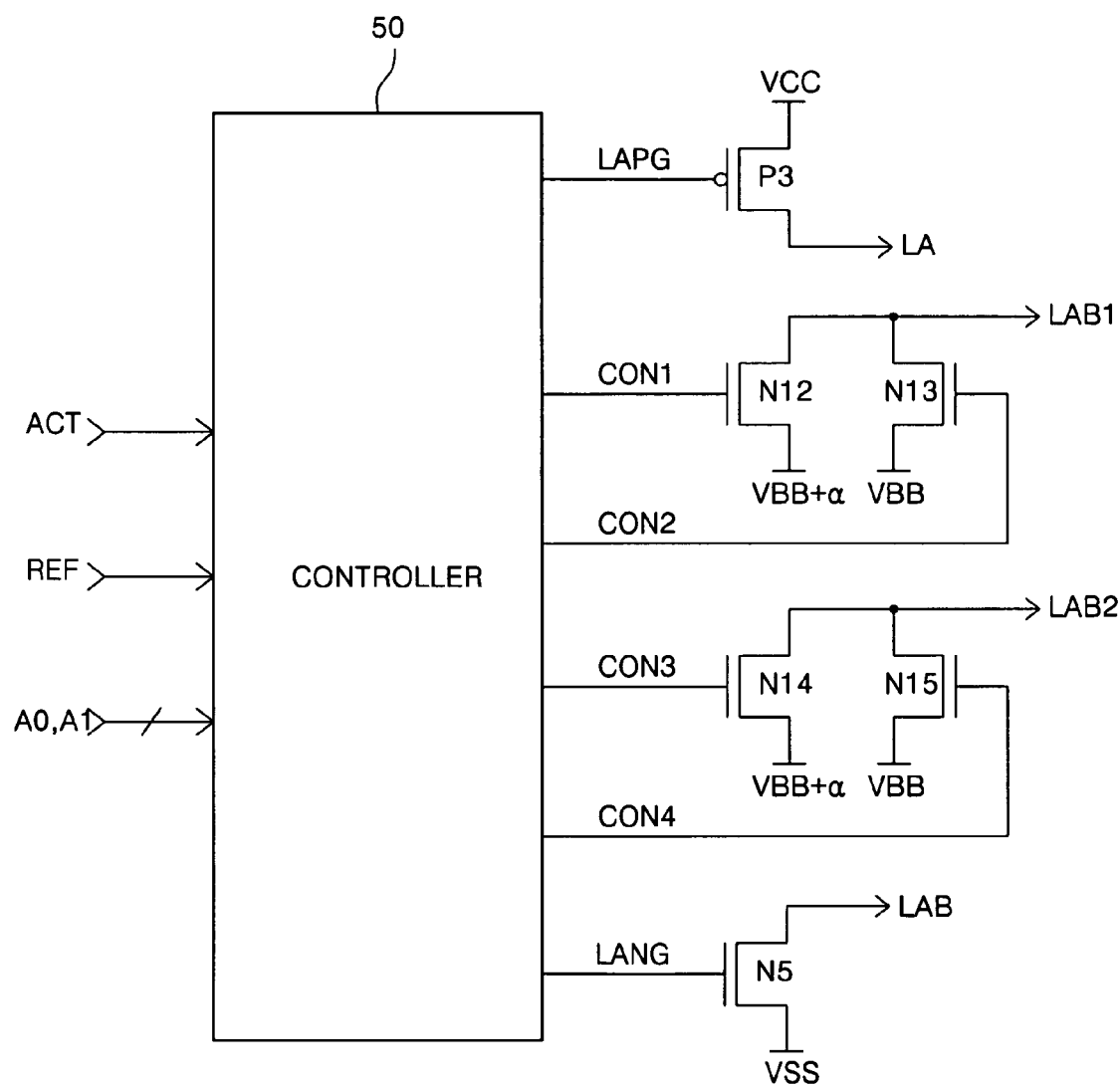
FIG. 14 is a view illustrating a circuit of generating signals LA, LAB, LAB1, and LAB2 of FIG. 13.

FIG. 14 is a view illustrating a circuit of generating signals LA, LAB, LAB1, and LAB2 of FIG. 13. The circuit of FIG. 14 includes a controller 50, a PMOS transistor P3, and NMOS transistors N5 and N12 to N15.

Functions of the components of FIG. 14 are explained below.

The controller 50 generates first and fourth substrate voltage control signals CON1 and CON4 of a high level and second and third substrate voltage control signals CON2 and CON3 of a low level if an active command ACT or a refresh command REF is applied and a 2-bit LSB of row address A0 and A1 is applied and so the 2-bit LSB of row address A0,A1 are "00" or "11". Here, a low level applied to the NMOS transistor N13 is a substrate voltage VBB level. The NMOS transistors N13 and N14 are turned off and the NMOS transistors N12 and N15 are turned on, so that a signal LAB1 of a higher voltage VBB+α than a substrate voltage VBB and a signal LAB2 of a substrate voltage VBB level are generated.

On the other hand, first and fourth substrate voltage control signals CON1 and CON4 of a low level and second and third substrate voltage control signals CON2 and CON3 of a high level are generated if an active command ACT or a refresh command REF is applied and a 2-bit LSB of row address A0 and A1 is applied and so the 2-bit LSB of row address A0,A1 are "01" or "10". Here, a low level applied to the NMOS transistor N15 is a substrate voltage VBB level. The NMOS transistors N12 and N15 are turned off and the NMOS transistors N13 and N14 are turned on, so that a signal LAB1 of a substrate voltage VBB and a signal LAB2 of a higher voltage VBB+α than a substrate voltage VBB level are generated.

Figure 15:
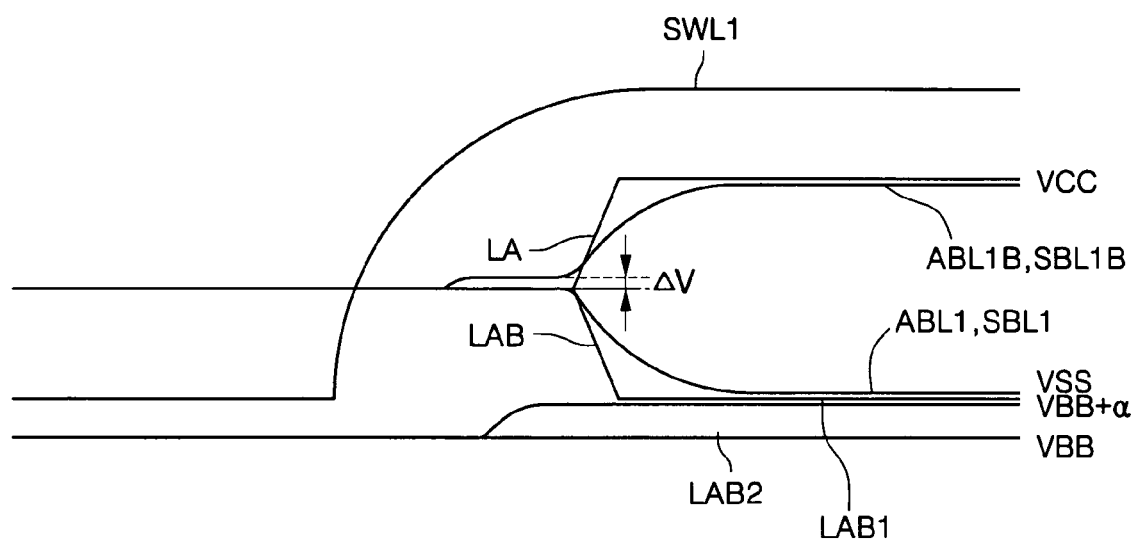
FIG. 15 is a timing diagram illustrating the refresh operation of the semiconductor memory device of FIG. 13.

Thereafter, first and second bit line sense amplifier enable control signals LAPG and LANG of a low level and a high level are generated. Therefore, the PMOS transistor P3 generates a signal LA of a power voltage VCC level in response to the first bit line sense amplifier enable control signal LAPG of a low level, and the NMOS transistor N5 generates a signal LAB of a ground voltage VSS level in response to the second bit line sense amplifier enable control signal LANG of a high level FIG. 15 is a timing diagram illustrating the refresh operation of the semiconductor memory device of FIG. 13. The refresh operation is performed under the same condition as that of FIG. 6.

Operation during the charge sharing operation period T is the same as the timing diagram of FIG. 6.

Thereafter, if a signal LAB1 of a higher voltage VBB+α than a substrate voltage VBB and a signal LAB2 of a substrate voltage VBB level are applied, a threshold voltage of the NMOS transistor N1 becomes lower than a threshold voltage of the NMOS transistor N2. If a signal LA of a power voltage VCC level and a signal LAB of a ground voltage VSS level are applied, the same operation as in the timing diagram of FIG. 6 is performed.

Even though not shown, if in state that the memory cell MC2 stores data of a high level and the array bit line pair ABL1,ABL1B and the sense bit line pair SBL1,SBL1B are precharged to a precharge voltage VBL level, the refresh command REF is applied so that the sub word line SWL2 is selected, a signal LAB1 of a substrate voltage VBB and a signal LAB2 of a higher voltage VBB+α than a substrate voltage VBB level are generated. Then, a signal LA of a power voltage VCC level and a signal LAB of a ground voltage VSS level are applied.

The semiconductor memory device of FIG. 13 has a different configuration but performs the same operation as that of FIG. 4.

Figure 16:
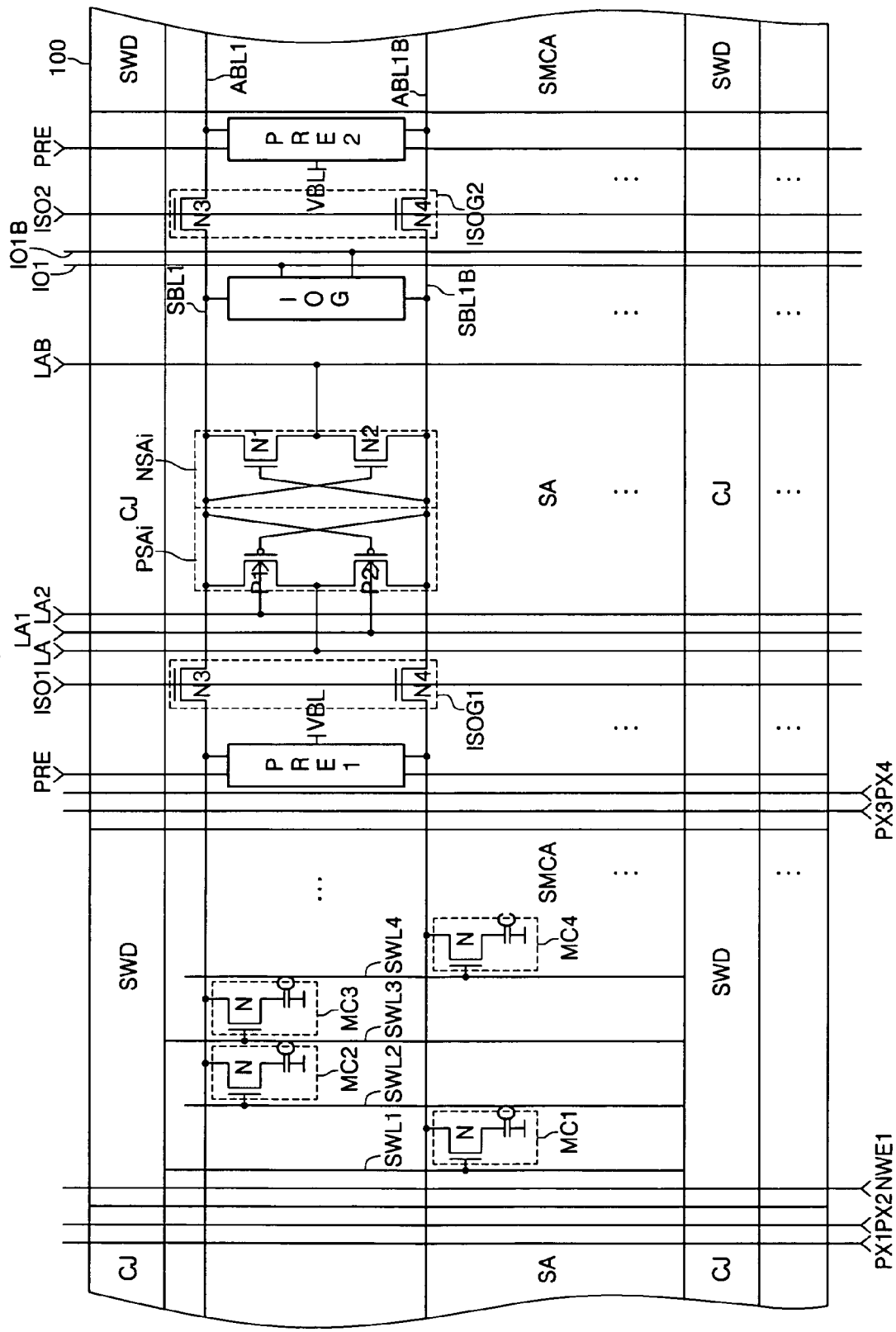
FIG. 16 is a block diagram illustrating configuration of a semiconductor memory device according to a fifth embodiment of the present invention.

FIG. 16 is a block diagram illustrating configuration of a semiconductor memory device according to a fifth embodiment of the present invention. The semiconductor memory device of FIG. 16 has the same configuration as that of FIG. 1 except that signals LA1 and LA2 are respectively applied to respective substrates of the PMOS transistors P1 and P2.

Like reference numerals of FIGS. 1 and 16 denote like parts and like functions. Thus, operation when the signals LA1 and LA2 are applied will be explained below.

If the memory cells MC1 and MC4 store data of a high level and the sub word line SWL1 or the sub word line SWL4 is selected during the refresh operation, the charge sharing operation is performed. Then, if a signal LA1 having a level lower than a power voltage VCC level and a signal LA2 of a power voltage VCC level are applied, a threshold voltage of the PMOS transistor P2 becomes lower than a threshold voltage of the PMOS transistor P1. Then, if a signal LA of a power voltage VCC level and a signal LAB of a ground voltage VSS level are applied, the same operation as the bit line sense amplifier of FIG. 7 is performed.

On the other hand, if the memory cells MC2 and MC3 store data of a high level and the sub word line SWL2 or the sub word line SWL3 is selected during the refresh operation, the charge sharing operation is performed. Then, if a signal LA2 having a level lower than a power voltage VCC level and a signal LA1 of a power voltage VCC level are applied, a threshold voltage of the PMOS transistor P1 becomes lower than a threshold voltage of the PMOS transistor P2. Then, if a signal LA of a power voltage VCC level and a signal LAB of a ground voltage VSS level are applied, the same operation as the bit line sense amplifier of FIG. 7 is performed.

Figure 17:
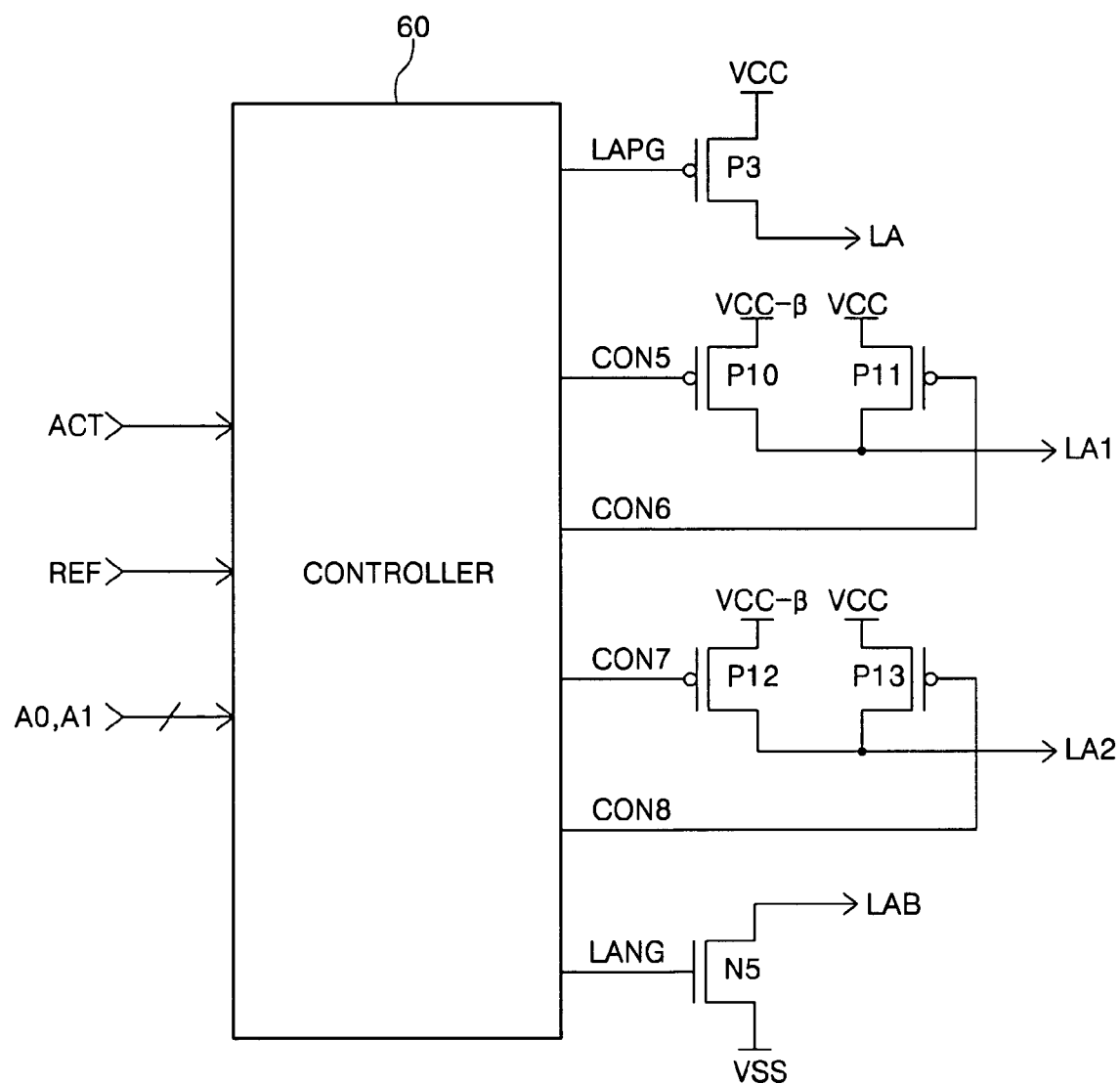
FIG. 17 is a view illustrating a circuit of generating signals LA, LAB, LA1, and LA2 of FIG. 16.

FIG. 17 is a view illustrating a circuit of generating signals LA, LAB, LA1, and LA2 of FIG. 16. The circuit of FIG. 17 includes a controller 60, PMOS transistors P3 and P10 to P13, and an NMOS transistor N5.

Functions of the components of FIG. 17 are explained below.

The controller 60 generates first and fourth substrate voltage control signals CON5 and CON8 of a low level and second and third substrate voltage control signals CON6 and CON7 of a high level if an active command ACT or a refresh command REF is applied and the 2-bit LSB of row address A0,A1 are "00" or "11". The PMOS transistors P10 and P13 are turned on and the PMOS transistors P11 and P12 are turned off, so that a signal LA2 of a power voltage VCC level and a signal LA1 of a lower voltage VCC-β level than a power voltage VCC level are generated.

On the other hand, first and fourth substrate voltage control signals CON5 and CON8 of a high level and second and third substrate voltage control signals CON6 and CON7 of a low level are generated if an active command ACT or a refresh command REF is applied and a 2-bit LSB of row address A0 and A1 is applied and so the 2-bit LSB of row address A0,A1 are "01" or "10". The PMOS transistors P10 and P13 are turned off and the PMOS transistors P11 and P12 are turned on, so that a signal LA1 of a power voltage VCC level and a signal LA2 of a lower voltage VCC-β level than a power voltage VCC level are generated.

Thereafter, first and second bit line sense amplifier enable control signals LAPG and LANG of a low level and a high level are generated. Therefore, the PMOS transistor P3 generates a signal LA of a power voltage VCC level in response to the first bit line sense amplifier enable control signal LAPG of a low level, and the NMOS transistor N5 generates a signal LAB of a ground voltage VSS level in response to the second bit line sense amplifier enable control signal LANG of a high level.

Figure 18:
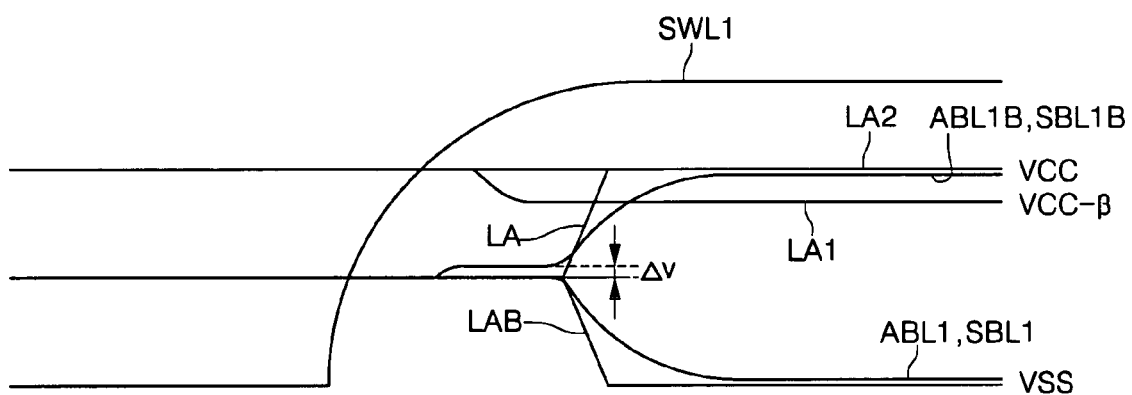
FIG. 18 is a timing diagram illustrating the refresh operation of the semiconductor memory device of FIG. 16.

FIG. 18 is a timing diagram illustrating the refresh operation of the semiconductor memory device of FIG. 16. The refresh operation is performed under the same condition as that of FIG. 3.

Operation during the charge sharing operation period T is the same as the timing diagram of FIG. 6.

Thereafter, if a signal LA1 of a lower voltage VCC-β than a power voltage VCC level and a signal LA2 of a power voltage VCC level are applied and a signal LA of a power voltage VCC level and a signal LAB of a ground voltage VSS level are applied, the same operation as in the timing diagram of FIG. 6 is performed.

Even though not shown, if in state that the memory cell MC2 stores data of a high level and the array bit line pair ABL1 ,ABL1B and the sense bit line pair SBL1,SBL1B are precharged to a precharge voltage VBL level, the refresh command REF is applied so that the sub word line SWL2 is selected, a signal LA1 of a power voltage VCC level and a signal LA2 of a lower voltage than a power voltage VCC level are generated, and a signal LA of a power voltage VCC level and a signal LAB of a ground voltage VSS level are applied.

The semiconductor memory device of FIG. 16 has a different configuration but performs the same operation as that of FIG. 7.

Figure 19:
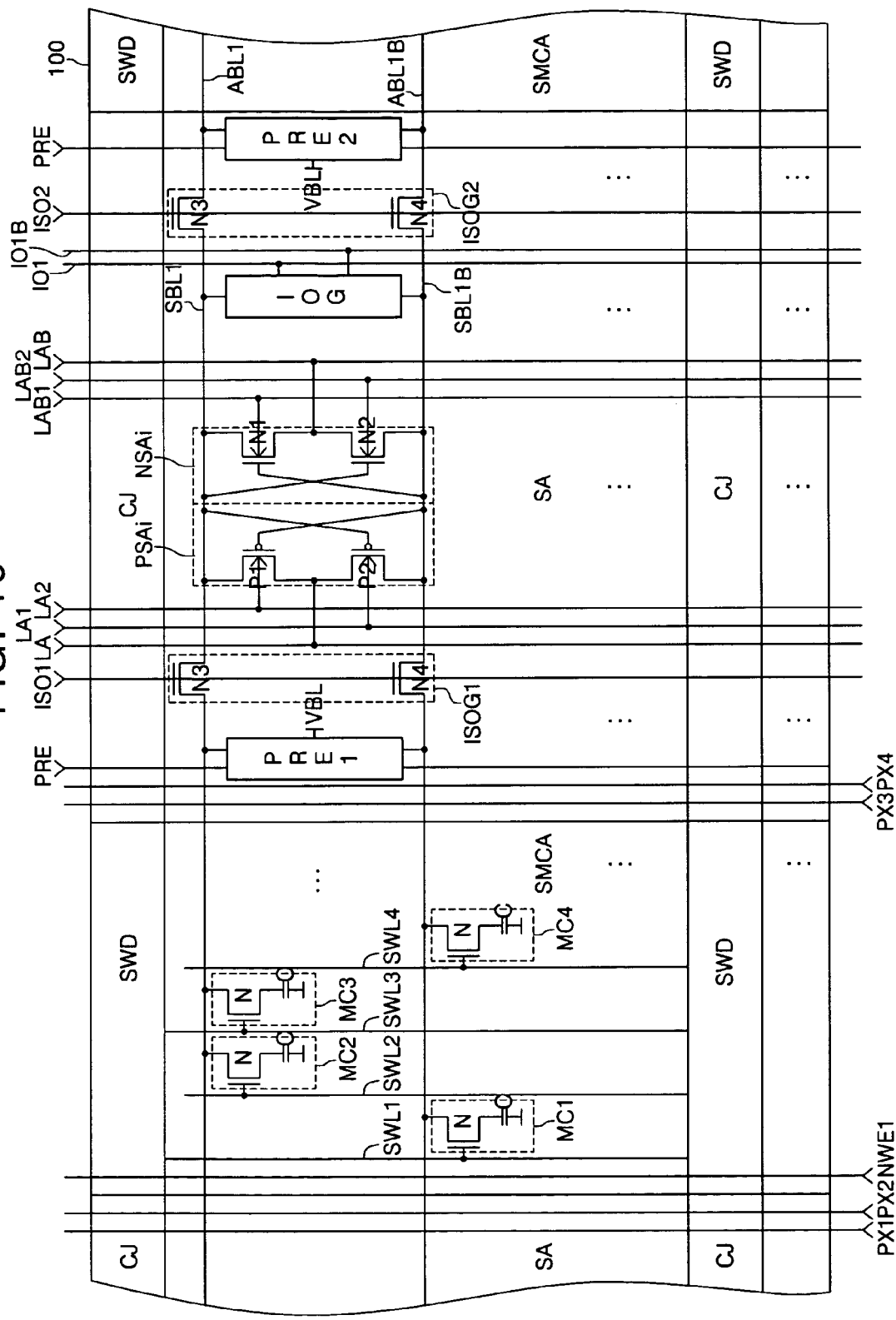
FIG. 19 is a block diagram illustrating configuration of a semiconductor memory device according to a sixth embodiment of the present invention.

FIG. 19 is a block diagram illustrating configuration of a semiconductor memory device according to a sixth embodiment of the present invention. The semiconductor memory device of FIG. 19 has the same configuration as that of FIG. 10 except that signals LA1 and LA2 are respectively applied to respective substrates of the PMOS transistors P1 and P2 and signals LAB1 and LAB2 are respectively applied to respective substrates of the NMOS transistors N1 and N2.

Like reference numerals of FIGS. 1 and 19 denote like parts and like functions. Thus, operation when the signals LA1, LA2, LAB1 and LAB2 are applied will be explained below.

If the memory cells MC1 and MC4 store data of a high level and the sub word line SWL1 or the sub word line SWL4 is selected during the refresh operation, the charge sharing operation is performed. Then, if a signal LA2 of a power voltage VCC level, a signal LAB1 having a level higher than a substrate voltage VBB, a signal LA1 of a lower voltage level than a power voltage VCC level, and a signal LAB2 of a substrate voltage VBB level are applied, a threshold voltage of the PMOS transistor P1 becomes higher than a threshold voltage of the PMOS transistor P2, and a threshold voltage of the NMOS transistor N1 becomes lower than a threshold voltage of the NMOS transistor N2. Then, if a signal LA of a power voltage VCC level and a signal LAB of a ground voltage VSS level are applied, the same operation as the bit line sense amplifier of FIG. 10 is performed.

On the other hand, if the memory cells MC2 and MC3 store data of a high level and the sub word line SWL2 or the sub word line SWL3 is selected during the refresh operation, the charge sharing operation is performed. Then, if a signal LA1 of a power voltage VCC level, a signal LAB2 having a level higher than a substrate voltage VBB, a signal LA2 of a lower voltage level than a power voltage VCC level, and a signal LAB1 of a substrate voltage VBB level are applied, a threshold voltage of the PMOS transistor P2 becomes higher than a threshold voltage of the PMOS transistor P1, and a threshold voltage of the NMOS transistor N2 becomes lower than a threshold voltage of the NMOS transistor N1. Then, if a signal LA of a power voltage VCC level and a signal LAB of a ground voltage VSS level are applied, the same operation as the bit line sense amplifier of FIG. 10 is performed.

Figure 20:
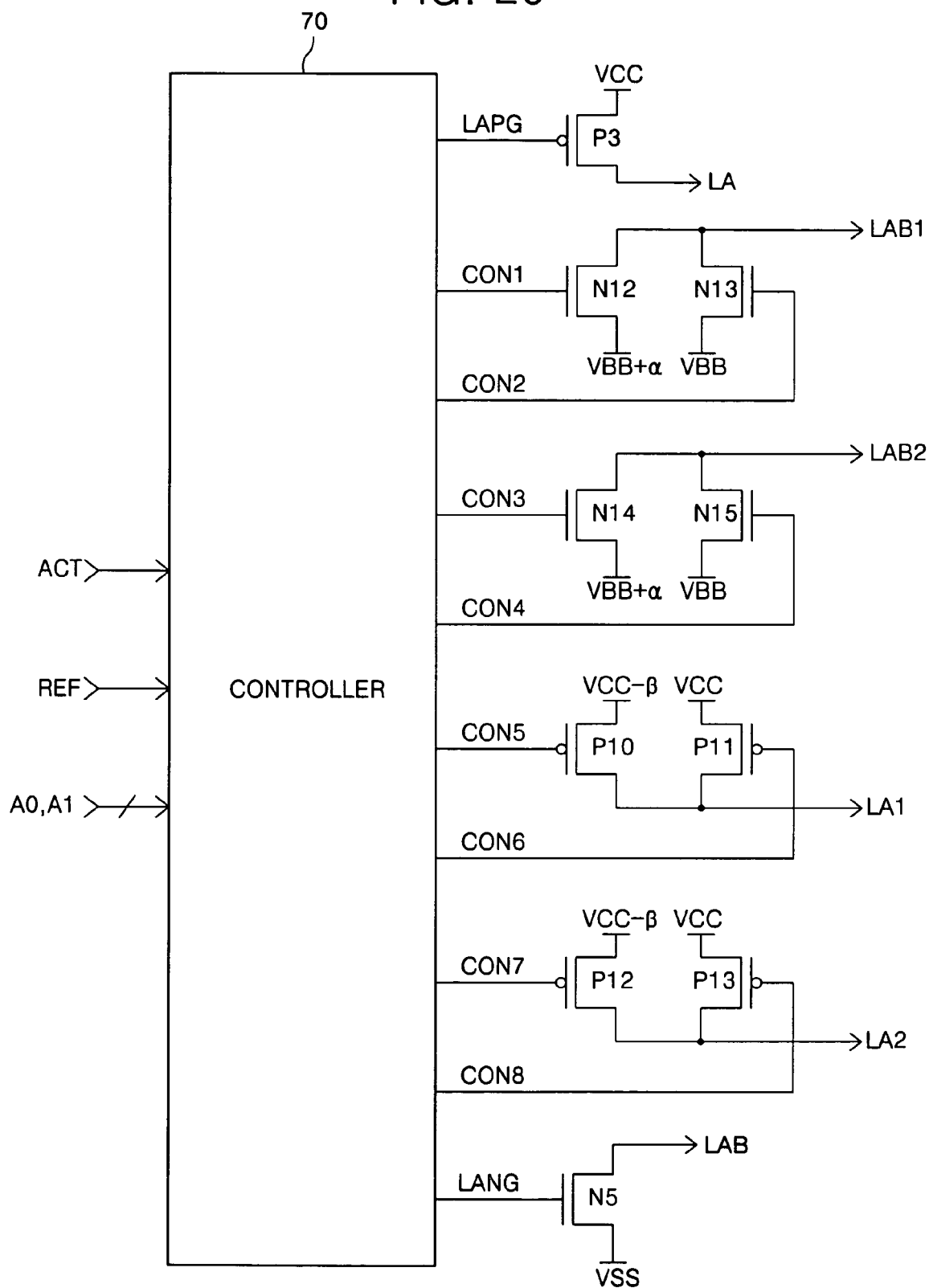
FIG. 20 is a view illustrating a circuit of generating signals LA, LAB, LA1, LA2, LAB1, and LAB2 of FIG. 19.

FIG. 20 is a view illustrating a circuit of generating signals LA, LAB, LA1, LA2, LAB1, and LAB2 of FIG. 19. The circuit of FIG. 20 includes a controller 70, PMOS transistors P3 and P10 to P13, and NMOS transistors N5 and N12 to N15.

Functions of the components of FIG. 20 are explained below.

The controller 70 generates first and fourth substrate voltage control signals CON1 and CON4 of a high level, second and third substrate voltage control signals CON2 and CON3 of a low level, fifth and eighth substrate voltage control signals CON5 and CON8 of a low level, and sixth and seventh substrate voltage control signals CON6 and CON7 of a high level if an active command ACT or a refresh command REF is applied and a 2-bit LSB of row address A0 and A1 is applied and so the 2-bit LSB of row address A0,A1 are "00" or "11". Here, a low level applied to the NMOS transistor N13 is a substrate voltage VBB level. The NMOS transistors N13 and N14 are turned off and the NMOS transistors N12 and N15 are turned on, so that a signal LAB1 of a higher voltage VBB+α than a substrate voltage VBB and a signal LAB2 of a substrate voltage VBB level are generated, and the PMOS transistors P10 and P13 are turned on and the PMOS transistors P11 and P12 are turned off, so that a signal LA2 of a power voltage VCC level and a signal LA1 of a lower voltage VCC-β than a power voltage VCC level are generated.

On the other hand, the controller 70 generates first and fourth substrate voltage control signals CON1 and CON4 of a low level, second and third substrate voltage control signals CON2 and CON3 of a high level, fifth and eighth substrate voltage control signals CON5 and CON8 of a high level, and sixth and seventh substrate voltage control signals CON6 and CON7 of a low level if an active command ACT or a refresh command REF is applied and a 2-bit LSB of row address A0 and A1 is applied and so the 2-bit LSB of row address A0,A1 are "01" or "10". Here, a low level applied to the NMOS transistor N 15 is a substrate voltage VBB level. The NMOS transistors N12 and N15 are turned off and the NMOS transistors N13 and N14 are turned on, so that a signal LAB2 of a higher voltage VBB+α than a substrate voltage VBB and a signal LAB1 of a substrate voltage VBB level are generated, and the PMOS transistors P10 and P13 are turned off and the PMOS transistors P11 and P12 are turned on, so that a signal LA1 of a power voltage VCC level and a signal LA2 of a lower voltage VCC-β than a power voltage VCC level are generated.

Thereafter, first and second bit line sense amplifier enable control signals LAPG and LANG of a low level and a high level are generated. Therefore, the PMOS transistor P3 generates a signal LA of a power voltage VCC level in response to the first bit line sense amplifier enable control signal LAPG of a low level, and the NMOS transistor N5 generates a signal LAB of a ground voltage VSS level in response to the second bit line sense amplifier enable control signal LANG of a high level.

Figure 21:
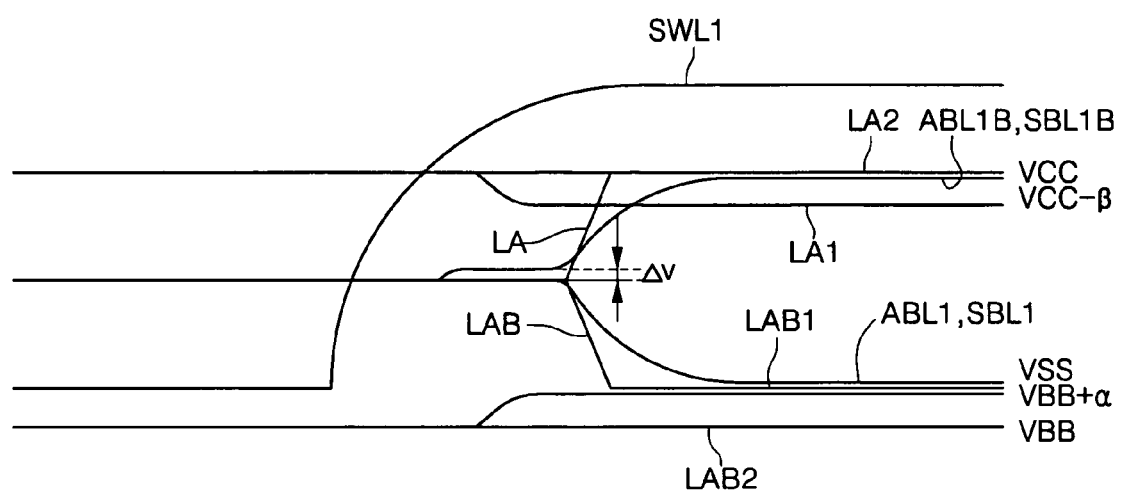
FIG. 21 is a timing diagram illustrating the refresh operation of the semiconductor memory device of FIG. 19.

FIG. 21 is a timing diagram illustrating the refresh operation of the semiconductor memory device of FIG. 19. The refresh operation is performed under the same condition as that of FIG. 3.

Operation during the charge sharing operation period T is the same as the timing diagram of FIG. 6.

Thereafter, if a signal LA2 of a power voltage VCC level, a signal LA1 of a lower voltage VCC-β level than a power voltage VCC level, a signal LAB1 of a higher voltage VBB+α than a substrate voltage VBB, and a signal LAB2 of a substrate voltage VBB level are generated and a signal LA of a power voltage VCC level and a signal LAB of a ground voltage VSS level are applied, the same operation as in the timing diagram of FIG. 12 is performed.

Even though not shown, if in state that the memory cell MC2 stores data of a high level and the array bit line pair ABL1,ABL1B and the sense bit line pair SBL1,SBL1B are precharged to a precharge voltage VBL level, the refresh command REF is applied so that the sub word line SWL2 is selected, a signal LA1 of a power voltage VCC level, a signal LA2 of a lower voltage VCC-β level than a power voltage VCC level, a signal LAB1 of a substrate voltage VBB, and a signal LAB2 of a higher voltage VBB+α than a substrate voltage VBB level are generated, and a signal LA of a power voltage VCC level and a signal LAB of a ground voltage VSS level are applied.

The semiconductor memory device of FIG. 19 has a different configuration but performs the same operation as that of FIG. 10.

The semiconductor memory device of the present invention described above improves the sensing ability for data of a high level by differentiating the sensing ability of the PMOS transistors which constitute the PMOS sense amplifier and/or the sensing ability of the NMOS transistors which constitute the NMOS sense amplifier. Therefore, it is possible to lengthen a refresh cycle of the semiconductor memory device.

The bit line sense amplifier of the semiconductor memory device of the present invention described above improves the sensing ability for data of a high level during the refresh operation and the read operation.

Accordingly, as described above, embodiments of the invention include sense amplifiers configured to sense and amplify relatively small differential signals established across a pair of differential sense bit lines. According to one these embodiments, a sense amplifier is provided with multiple MOS sense amplifiers therein. As illustrated by FIG. 4, these MOS sense amplifiers include a first NMOS sense amplifier (NSAi, NSAj) having a first pair of NMOS transistors N6 and N7 of first conductivity type therein electrically coupled across a pair of sense bit lines SBL1 and SBL1B. This first pair of NMOS transistors N6 and N7 are configured to have different threshold voltages so that enhanced sensing of relatively small differential voltages on the sense bit lines can be achieved. Alternatively, as illustrated by FIG. 13, a first pair of NMOS transistors N1 and N2 may support different threshold voltage biasing. This different threshold voltage biasing may be achieved by independently controlling the level at which the substrate terminals of these NMOS transistors are biased during a sense and amplify operation. These MOS sense amplifiers may also include a second MOS sense amplifier PSA (PSAi in FIG. 13) having a first pair of PMOS transistors P1 and P2 therein electrically coupled across the pair of sense bit lines SBL1 and SBL1B.

Referring again to FIG. 4, the first MOS sense amplifier may also includes a second pair of NMOS transistors N8 and N9 electrically coupled across the pair of sense bit lines SBL1 and SBL1B. This second pair of MOS transistors N8 and N9 is configured to have different threshold voltages as well. Similarly, as illustrated by FIG. 7, a first pair of PMOS transistors P6 and P7 can be configured to have different threshold voltages or, as illustrated by FIG. 16, the first pair of PMOS transistors P1 and P2 can support different threshold voltage biasing.

Referring again to FIG. 13, a first NMOS sense amplifier NSAi has a pair of NMOS transistors N1 and N2. First, second and third sense amplifier enable lines LAB, LAB1 and LAB2 are also provided. The first sense amplifier enable line LAB is electrically coupled to source terminals of the pair of NMOS transistors N1 and N2. However, to support different threshold voltage biasing, the second sense amplifier enable line LAB1 is electrically coupled to a substrate terminal of NMOS transistor N1 and the third sense amplifier enable line LAB2 is electrically coupled to a substrate terminal of NMOS transistor N2. As illustrated by FIGS. 14-15, controller/driver is also provided. This controller is configured to independently drive the first, second and third sense amplifier enable lines during an operation to amplify a differential voltage established across the pair of sense bit lines.

As described herein before, the semiconductor memory device and the bit line sensing method according to the present invention can lengthen the refresh cycle by improving the sensing ability of data of a high level, thereby reducing power consumption of the refresh operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A sense amplifier, comprising:
a pair of sense bit lines;
a first MOS sense amplifier having a first pair of MOS transistors of first conductivity type therein electrically coupled across said pair of sense bit lines so that each of the first pair of MOS transistors has a first source/drain terminal electrically connected to a corresponding one of said pair of sense bit lines and the second source/drain terminals of the first pair of MOS transistors are electrically connected together, said first pair of MOS transistors of first conductivity type configured to have different threshold voltages or support different threshold voltage biasing;
a second MOS sense amplifier having a first pair of MOS transistors of second conductivity type therein electrically coupled across said pair of sense bit lines;
a first sense amplifier enable line electrically coupled to source terminals of the first pair of MOS transistors of first conductivity type;
a second sense amplifier enable line electrically coupled to source terminals of the first pair of MOS transistors of second conductivity type;
a third sense amplifier enable line electrically coupled to a substrate terminal of a first one of the first pair of MOS transistors of first conductivity type;
a fourth sense amplifier enable line electrically coupled to a substrate terminal of a second one of the first pair of MOS transistors of first conductivity type; and
a controller configured to independently drive said first, second, third and fourth sense amplifier enable lines during an operation to amplify a differential voltage established across said pair of sense bit lines.

2. A sense amplifier, comprising:
a pair of sense bit lines;
a first MOS sense amplifier having a first pair of MOS transistors of first conductivity type therein electrically coupled across said pair of sense bit lines so that each of the first pair of MOS transistors has a first source/drain terminal electrically connected to a corresponding one of said pair of sense bit lines and the second source/drain terminals of the first pair of MOS transistors are electrically connected together, said first pair of MOS transistors of first conductivity type configured to have different threshold voltages or support different threshold voltage biasing;
a second MOS sense amplifier having a first pair of MOS transistors of second conductivity type therein electrically coupled across said pair of sense bit lines;
a first sense amplifier enable line electrically coupled to source terminals of the first pair of MOS transistors of first conductivity type;
a second sense amplifier enable line electrically coupled to source terminals of the first pair of MOS transistors of second conductivity type;
a third sense amplifier enable line electrically coupled to a substrate terminal of a first one of the first pair of MOS transistors of first conductivity type;
a fourth sense amplifier enable line electrically coupled to a substrate terminal of a second one of the first pair of MOS transistors of first conductivity type;

a fifth sense amplifier enable line electrically coupled to a substrate terminal of a first one of the first pair of MOS transistors of second conductivity type;

a sixth sense amplifier enable line electrically coupled to a substrate terminal of a second one of the first pair of MOS transistors of second conductivity type; and a controller configured to independently drive said first, second, third, fourth, fifth and sixth sense amplifier enable lines during an operation to amplify a differential voltage established across said pair of sense bit lines.

3. A sense amplifier, comprising:

a pair of sense bit lines;

a first MOS sense amplifier comprising:

a first pair of MOS transistors of first conductivity type electrically coupled across said pair of sense bit lines, said first pair of MOS transistors of first conductivity type configured to have different threshold voltages; and a second pair of MOS transistors of first conductivity type electrically coupled across said pair of sense bit lines; said second pair of MOS transistors of first conductivity type configured to have different threshold voltages; and a second MOS sense amplifier having a first pair of MOS transistors of second conductivity type therein electrically coupled across said pair of sense bit lines;

wherein a first one of the first pair of MOS transistors of first conductivity type having a gate terminal electrically coupled to a first one of said pair of sense bit lines has a greater threshold voltage relative to a second one of the first pair of MOS transistors of first conductivity type having a gate terminal electrically coupled to a second one of said pair of sense bit lines; and wherein a first one of the second pair of MOS transistors of first conductivity type having a gate terminal electrically coupled to the second one of said pair of sense bit lines has a greater threshold voltage relative to a second one of the second pair of MOS transistors of first conductivity type having a gate terminal electrically coupled to the first one of said pair of sense bit lines.

* * * * *